(12) United States Patent
Yajima

(10) Patent No.: US 9,607,954 B2
(45) Date of Patent: Mar. 28, 2017

(54) METHOD OF MANUFACTURING SEMICONDUCTOR DEVICE AND SEMICONDUCTOR DEVICE

(71) Applicant: Renesas Electronics Corporation, Tokyo (JP)

(72) Inventor: Akira Yajima, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/154,954

(22) Filed: May 14, 2016

(65) Prior Publication Data

US 2017/0040267 A1 Feb. 9, 2017

(30) Foreign Application Priority Data

Aug. 5, 2015 (JP) ................................. 2015-155138

(51) Int. Cl.
*H01L 21/66* (2006.01)
*H01L 23/00* (2006.01)

(52) U.S. Cl.
CPC .............. *H01L 24/02* (2013.01); *H01L 22/32* (2013.01); *H01L 24/05* (2013.01); *H01L 24/13* (2013.01); *H01L 2224/0239* (2013.01); *H01L 2224/02315* (2013.01); *H01L 2224/02331* (2013.01); *H01L 2224/0401* (2013.01); *H01L 2224/05024* (2013.01); *H01L 2224/05073* (2013.01); *H01L 2224/05164* (2013.01); *H01L 2224/05169* (2013.01); *H01L 2224/05173* (2013.01); *H01L 2224/05176* (2013.01); *H01L 2224/05178* (2013.01); *H01L 2224/10126* (2013.01); *H01L 2224/13006* (2013.01); *H01L 2224/13014* (2013.01); *H01L 2224/13026* (2013.01); *H01L 2924/14511* (2013.01)

(58) Field of Classification Search
CPC ......... H01L 24/02; H01L 24/05; H01L 24/13; H01L 22/32
See application file for complete search history.

(56) References Cited

U.S. PATENT DOCUMENTS

2003/0153172 A1* 8/2003 Yajima .................... H01L 22/34
438/612
2009/0134016 A1* 5/2009 Belanger ................. C22C 19/03
204/192.25

(Continued)

FOREIGN PATENT DOCUMENTS

JP 2000-138316 A 5/2000
JP 2001-053075 A 2/2001

*Primary Examiner* — Christine Enad
(74) *Attorney, Agent, or Firm* — McGinn IP Law Group, PLLC

(57) ABSTRACT

Object is to prevent a coupling failure between a rewiring and a coupling member for coupling to outside. A passivation film and a first polyimide film are formed so as to cover a wiring layer. A first opening portion is formed in the first polyimide film. A rewiring is formed on the first polyimide film so as to be coupled to the wiring layer via the first opening portion. A second polyimide film that covers the rewiring and has a second opening portion communicated with the rewiring is formed. A palladium film is formed as a barrier film by sputtering on a portion of the surface of the rewiring at which the second opening portion exists. A solder ball is coupled to the palladium film.

20 Claims, 46 Drawing Sheets

(56) References Cited

U.S. PATENT DOCUMENTS

| | | | |
|---|---|---|---|
| 2009/0206486 A1* | 8/2009 | Lin | H01L 21/76801 |
| | | | 257/759 |
| 2013/0147031 A1* | 6/2013 | Chen | H01L 24/11 |
| | | | 257/737 |
| 2015/0137352 A1* | 5/2015 | Chen | H01L 24/13 |
| | | | 257/737 |

* cited by examiner

METHOD OF MANUFACTURING SEMICONDUCTOR DEVICE AND SEMICONDUCTOR DEVICE

CROSS-REFERENCE TO RELATED APPLICATIONS

The disclosure of Japanese Patent Application No. 2015-155138 filed on Aug. 5, 2015 including the specification, drawings, and abstract is incorporated herein by reference in its entirety.

BACKGROUND

The present invention relates to a method of manufacturing a semiconductor device and a semiconductor device, for example, those suited for use in a semiconductor device equipped with a rewiring and a solder ball.

Semiconductor device packages such as flip chip ball grid array (FC-BGA), wafer level chip size package, and the like have been used frequently in order to meet the demand for high-performance, high-function, and high density electronic devices. For example, in the wafer level chip size package, after a series of steps for forming elements, wirings, and the like on a substrate (wafer), a passivation film is formed, a rewiring and a solder ball are formed on the resulting passivation film, and then, the resulting substrate is divided into individual chips. Patent Documents 1 and 2 disclose such a chip size package.

A semiconductor device is, for example, that including a flash memory as a nonvolatile memory. Such a semiconductor device receives a memory retention test of data stored in the flash memory. In the memory retention test, whether or not the data (memory) disappear by baking (retention baking) at 250° C. for about 12 hours is determined. Since the baking temperature (250° C.) approximates to the melting point of a solder ball, the memory retention test cannot be performed after formation of the solder ball.

The memory retention test may then be performed before formation of a rewiring or after formation of a rewiring but before formation of a solder ball. Based on various technological situations, the present inventors have decided to perform the memory retention test before formation of a solder ball after formation of a rewiring.

A rewiring is a wiring for electrically coupling an aluminum electrode (pad) below a passivation film to a solder ball and as a material of it, copper (Cu) having a relatively low resistance is used. The rewiring made of copper is presumed to adversely affect a semiconductor device because tin (Sn) contained in the solder ball diffuses copper. In order to prevent it, a nickel film is formed as a barrier film on the surface of the rewiring. Further, in the rewiring, a thin gold film is formed as a wetting layer on the surface of the nickel film in order to achieve good coupling between the solder ball and the rewiring. The gold film is formed by substitution gold plating.

The memory retention test is performed by bringing a probe needle into contact with the gold film. After the memory retention test, the solder ball is coupled to the gold film, visual inspection and the like are performed, and then, the wafer is divided into semiconductor chips by dicing in the scribe region. Thus, manufacture of a semiconductor chip is completed.

[Patent Document 1] Japanese Unexamined Patent Application Publication No. 2001-53075

[Patent Document 2] Japanese Unexamined Patent Application Publication No. 2000-138316

SUMMARY

The present inventors have revealed this time that when a semiconductor device having, on a copper rewiring thereof, a gold film formed by substitution gold plating is subjected to a memory retention test, nickel is inevitably deposited on the surface of the gold film by baking. This deteriorates the wetness of solder, prevents complete bonding between the gold film and a coupling member such as a solder ball to be used for coupling to the outside, and causes a coupling failure between the rewiring and the coupling member.

Another problem and novel feature will be apparent from the description herein and accompanying drawings.

A method of manufacturing a semiconductor device according to one embodiment has the following steps. A semiconductor element is formed in an element formation region. A plurality of wiring layers is formed above the semiconductor element. With one of the uppermost wiring layers in a plurality of wiring layers as a first pad electrode, a first insulating film is formed so as to cover the first pad electrode. A first opening portion for exposing the first pad electrode therefrom is formed in the first insulating film. A rewiring is formed on the first insulating film while coupling it to the first pad electrode via the first opening portion. A second insulating film that covers the rewiring and having a second opening portion communicated with the rewiring is formed. A barrier film is formed on at least portion of the surface of the rewiring where the second opening portion is present. After formation of the barrier film, a semiconductor element is tested while performing heat treatment. A coupling member for electrically coupling to the outside is coupled to the barrier film. The step of forming the barrier film includes a step of forming at least a film made of any one of materials selected from the group comprised of palladium (Pd), ruthenium (Ru), rhodium (Rh), platinum (Pt), and iridium (Ir).

A semiconductor device according to another embodiment has a semiconductor element, a plurality of wiring layers, a first insulating film, a rewiring, a second insulating film, a barrier film, and a coupling member. One of the uppermost wiring layers in a plurality of wiring layers serves as a first pad electrode. The rewiring is formed on the first insulating film while being electrically coupled to the first pad electrode via a first opening formed in the first insulating film. The barrier film is formed on the surface of a portion of the rewiring positioned at the bottom of the second opening portion formed in the second insulating film. The coupling member for electrical coupling to the outside is coupled to the barrier film. The barrier film has a film made of any one of materials selected from the group comprised of palladium (Pd), ruthenium (Ru), rhodium (Rh), platinum (Pt), and iridium (Ir).

The method of manufacturing a semiconductor device according to one embodiment achieves reliable coupling between a coupling member and a rewiring.

The semiconductor device according to another embodiment can provide a semiconductor device having a coupling member and a rewiring reliably coupled to each other.

DETAILED DESCRIPTIONS

First Embodiment

Here, as a first example of a barrier film, a palladium (Pd) film formed by sputtering will be described.

Figure 1:
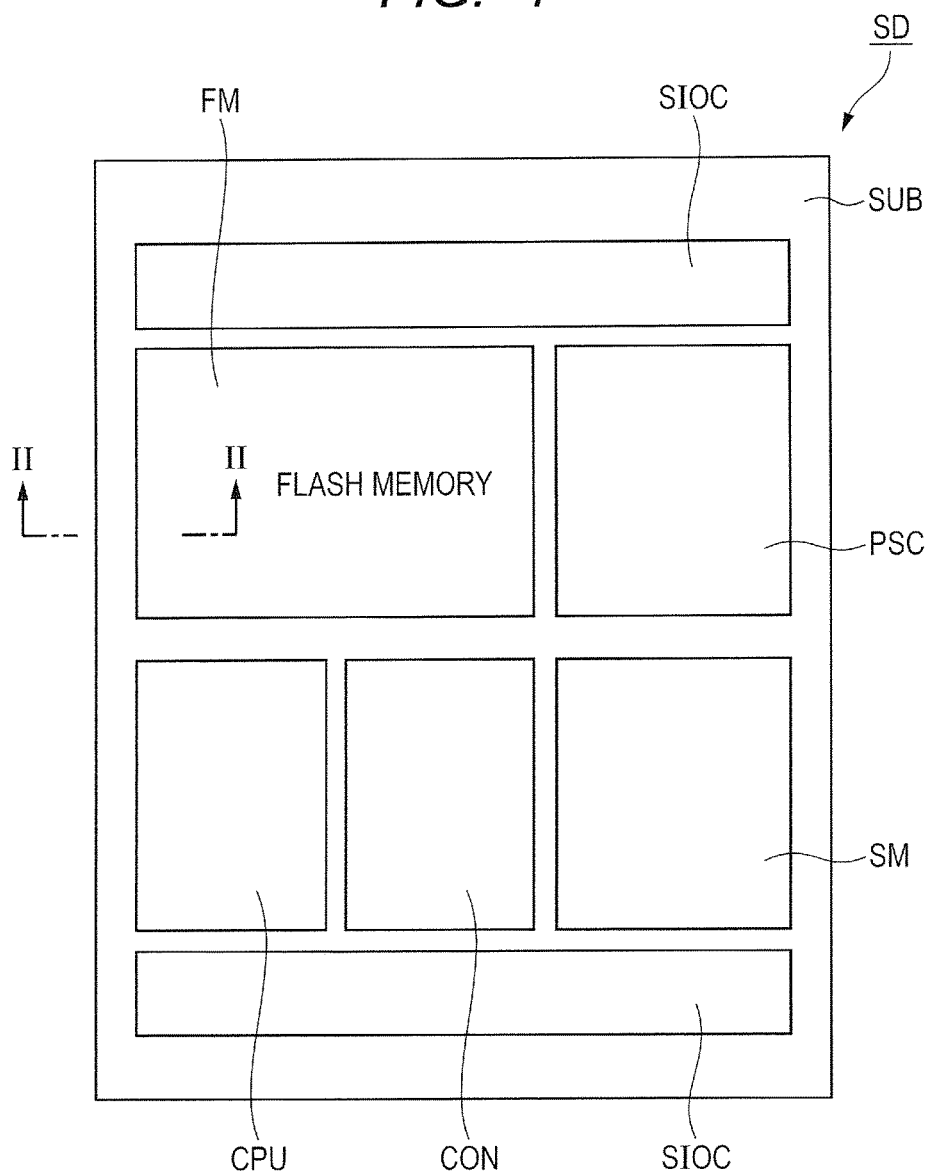
FIG. 1 schematically shows one example of a planar structure of a semiconductor device according to First Embodiment.

First, one example of the entire configuration of a semiconductor device is described. As shown in FIG. 1, a semiconductor device SD has a plurality of circuits each have a predetermined function. A semiconductor substrate SUB has thereon, as the circuits, for example, a power supply circuit PSC, a signal input/output circuit SIOC, a DA-AD converter CON, a static random access memory SM, a flash memory FM, and a central processing unit CPU.

Figure 2:
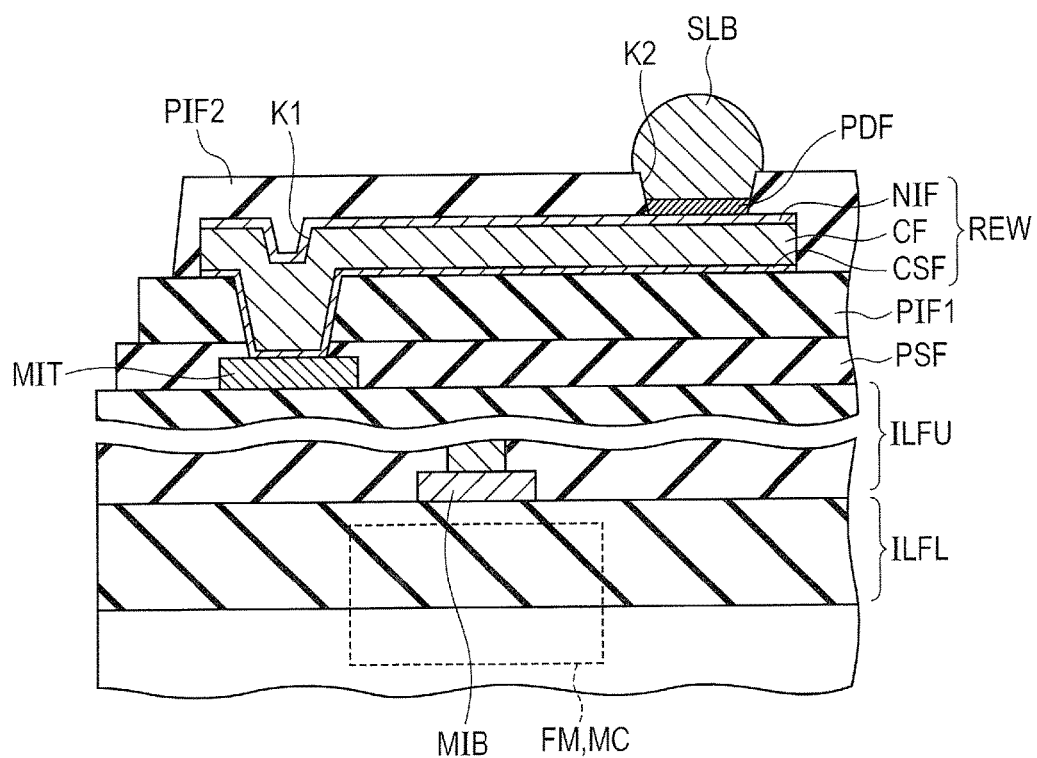
FIG. 2 is a cross-sectional view taken along the cross-sectional line II-II shown in FIG. 1 in First Embodiment.
Figure 3:
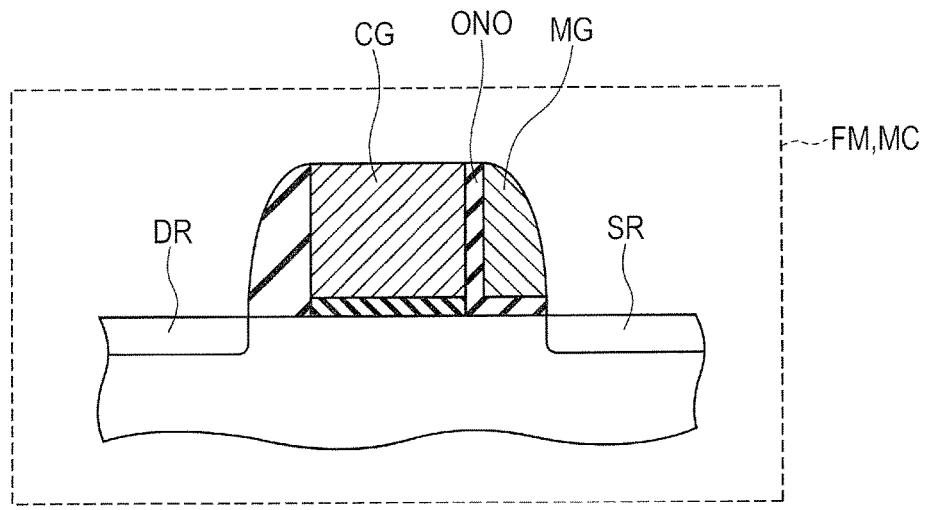
FIG. 3 is a partially enlarged cross-sectional view showing one example of the structure of a memory cell of the flash memory shown in FIG. 2 in First Embodiment.

Next, the cross-sectional structure of the semiconductor device is described using a region having therein a flash memory FM as one example. As shown in FIG. 2, a region of the semiconductor substrate SUB having therein the flash memory FM (semiconductor element) has a memory cell MC of the flash memory. As shown in FIG. 3, the memory cell MC is equipped with a control gate electrode CG, a memory gate electrode MG, a source region SR, and a drain region DR.

The memory gate electrode MG is present on one of the side surfaces of the control gate electrode CG while having an insulating film ONO therebetween. The insulating film ONO is comprised of a stacked film obtained by stacking a silicon oxide film, a silicon nitride film, and a silicon oxide film one after another. Such a memory cell is called a MONOS (metal-oxide-nitride-oxide-silicon) type. In particular, when it is a flash memory, it is called a "FMONOS" (flash-metal-oxide-nitride-oxide-silicon) type.

As shown in FIG. 2, an interlayer insulating film ILFL covers the memory cell MC. The interlayer insulating film ILFL has, on the surface thereof, a wiring layer MIB. The wiring layer MIB is covered by an interlayer insulating film ILFU comprised of a plurality of layers. The interlayer insulating film ILFU has therein a wiring layer (not shown). The uppermost layer of the interlayer insulating films ILFU has, on the surface thereof, a wiring layer MIT. The wiring layer MIB, the wiring layer formed in the interlayer insulating film ILFU, and the wiring layer MIT configure a plurality of (many) wiring layers. The wiring layer MIT is the uppermost layer of the wiring layers and here, it is shown as a pad electrode.

The wiring layer MIT is covered by a passivation film PSF made of, for example, a silicon nitride film. The passivation film PSF is covered by a polyimide film PIF1. The polyimide film PIF1 has, on the surface thereof, a rewiring REW made of copper. The rewiring REW is comprised of a copper seed layer CSF, a copper film CF, and a nickel film NIF. The rewiring REW is coupled to the wiring layer MIT via an opening portion K1 penetrating through the polyimide film PIF or the like.

Further, the rewiring REW is covered by a polyimide film PIF2. The polyimide film PIF2 has therein an opening portion K2 that penetrates through the polyimide film PIF2 and reaches the rewiring REW. The opening portion K2 has, on the bottom thereof, a palladium film PDF as a barrier film so as to be brought into contact with the rewiring REW. As described later, the palladium film PDF is formed by sputtering. The palladium film PDF has, onto the surface thereof, a solder ball SLB (bump) coupled. The main portion of the semiconductor device has the following configuration.

Figure 4:
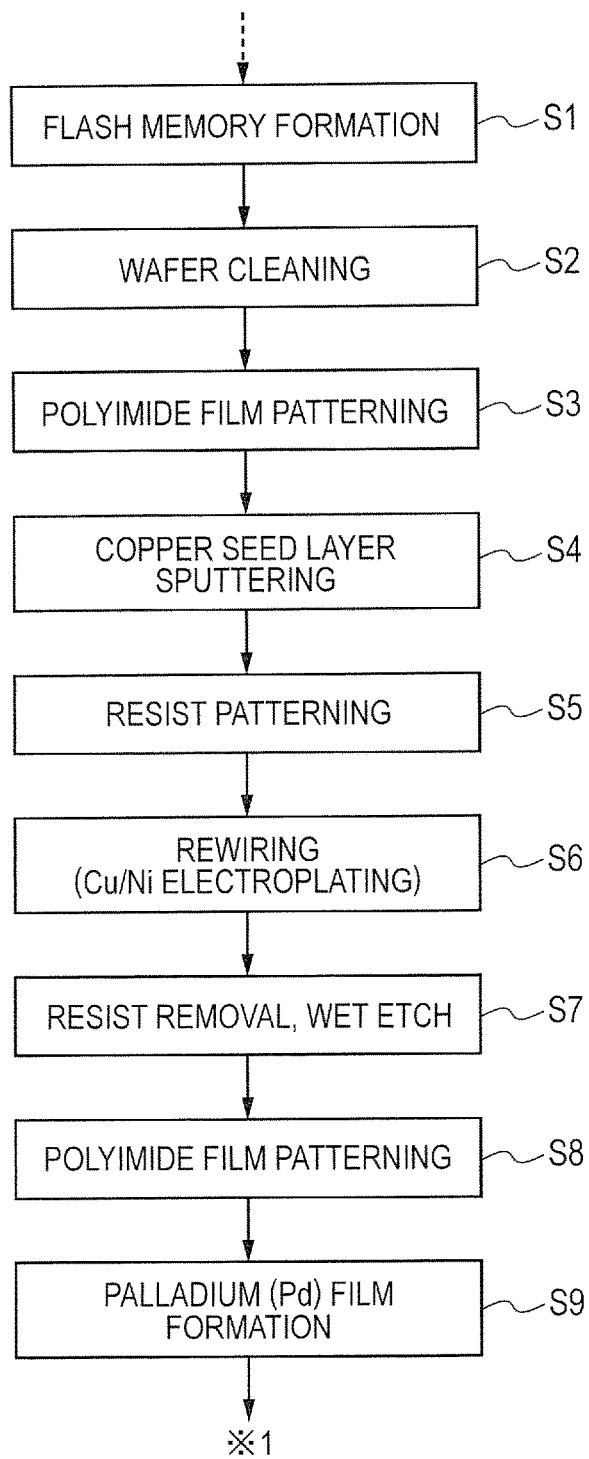
FIG. 4 shows a manufacturing flow of the semiconductor device of First Embodiment.

Next, a method of manufacturing the above-described semiconductor device is described. First, a manufacturing flow is described. First, an element formation region and a scribe region are defined in the substrate. Next, as shown in FIG. 4, in Step S1, a flash memory as a semiconductor element is formed in the element formation region. Then, after formation of an interlayer insulating film, a wiring layer, and the like that cover the semiconductor element such as flash memory, a passivation film is formed.

Next, in Step S2, a wafer (semiconductor substrate) is cleaned with a predetermined cleaning liquid. Next, in Step S3, polyimide is applied to the wafer, followed by patterning into a desired shape. Next, in Step S4, sputtering is performed to form a copper seed layer. Next, in Step S5, a photoresist pattern corresponding to the pattern of a rewiring is formed. Next, in Step S6, a copper rewiring is formed. A copper film is formed by electroplating of copper and a nickel film is formed by electroplating of nickel.

Next, in Step S7, the photoresist pattern is removed and an exposed portion of the copper seed layer is removed. Next, in Step S8, polyimide is applied to the wafer and a polyimide film having an opening portion that exposes therefrom the rewiring is formed. Next, in Step S9, a palladium film is formed by sputtering so as to cover the polyimide film. While leaving a portion of the polyimide film at the opening portion, the other portion of the polyimide film in the other region is removed.

Figure 5:
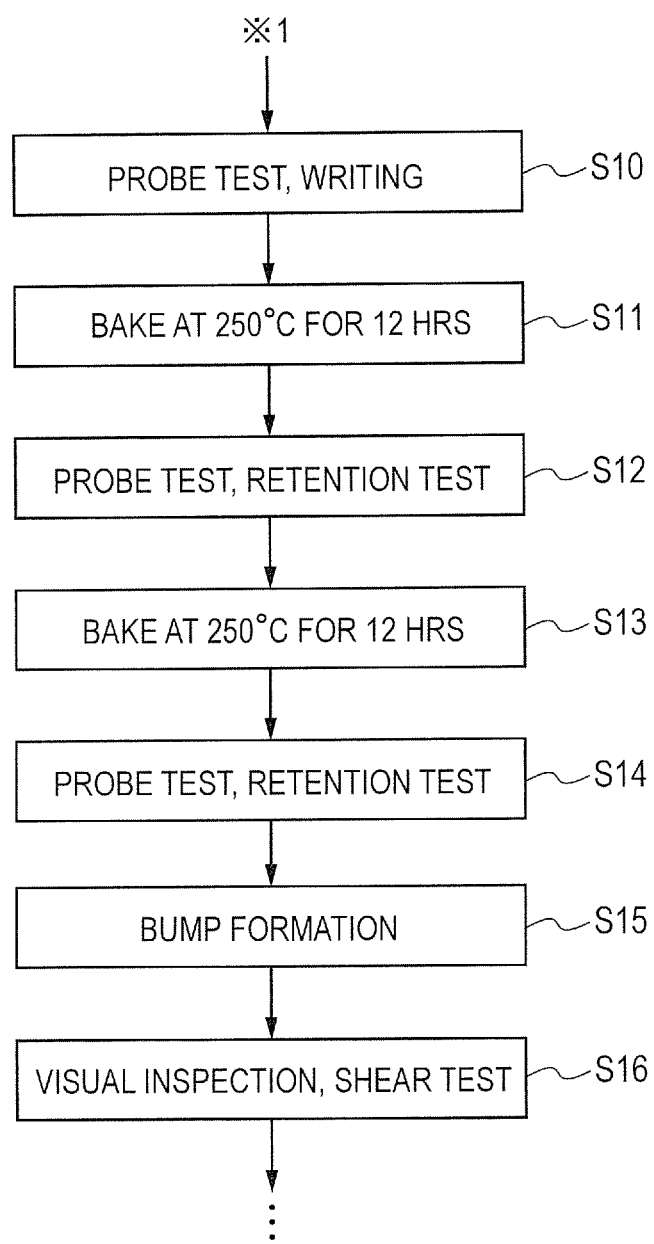
FIG. 5 shows a manufacturing flow performed after the manufacturing flow shown in FIG. 4 in First Embodiment.

Next, as shown in FIG. 5, in Step S10, data are written into the flash memory as a probe test. Next, in Steps S11 to S14, baking (at 250° C. for 12 hours) and a memory retention test are performed alternately. In Step S15, a solder ball (bump) is formed on the surface of the palladium film. Next, visual inspection and a shear test are performed in Step S16. By dicing in the scribe region, the wafer is then divided into individuals and thus, they are completed as semiconductor chips.

Figure 6:
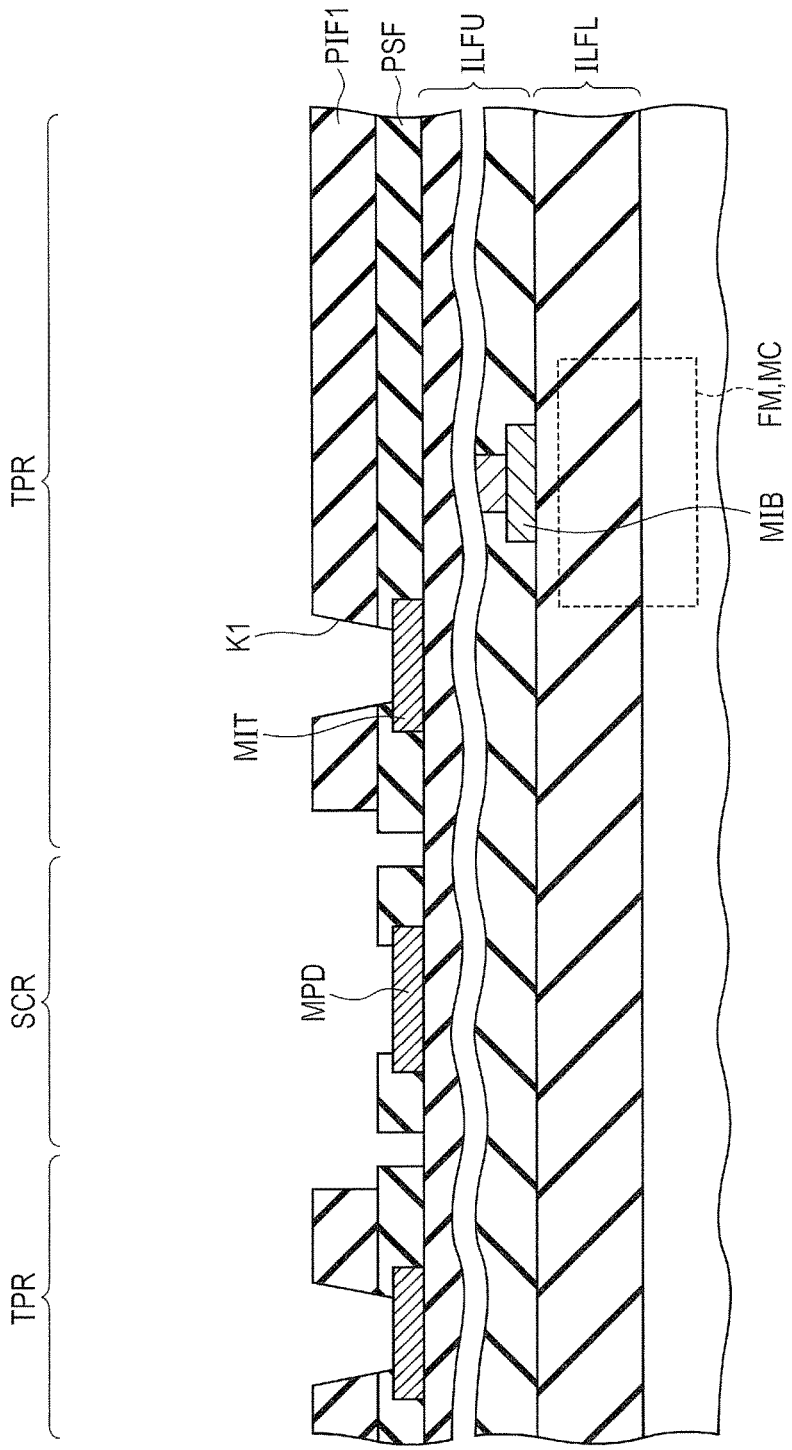
FIG. 6 is a cross-sectional view showing one step of a method of manufacturing a semiconductor device in First Embodiment.

Next, a method of manufacturing the semiconductor device is described specifically referring to cross-sectional views. As shown in FIG. 6, a chip region TPR and a scribe region SCR are defined in a substrate SUB. In the chip region TPR, a flash memory FM including a memory cell MC is formed as a semiconductor element. Next, an interlayer insulating film ILFL is formed so as to cover the semiconductor element such as flash memory FM. Next, a wiring layer MIB is formed on the surface of the interlayer insulating film ILFL.

Next, interlayer insulating films ILFU comprised of a plurality of layers are formed successively so as to cover the wiring layer MIB. During formation of the interlayer insulating films ILFU, a predetermined wiring layer (not shown) is formed. Next, in the chip region TPR, a wiring layer MIT is formed on the surface of the uppermost layer of the interlayer insulating films ILFU. A pad electrode MPD is formed in the scribe region SCR simultaneously with the formation of the wiring layer MIT. Next, a passivation film PSF having opening patterns that respectively expose the wiring layer MIT and the pad electrode MPD therefrom are formed.

Next, the wafer (semiconductor substrate) is cleaned with a predetermined cleaning liquid. Next, polyimide is applied onto the passivation film PSF and by predetermined photolithography and etching, a polyimide film PIF1 is formed. In the chip region TPR, an opening portion K1 is formed in the polyimide film PIF1 to expose the surface of the wiring layer MIT. In the scribe region SCR, on the other hand, the polyimide film is removed and the pad electrode MPD is exposed.

Figure 7:
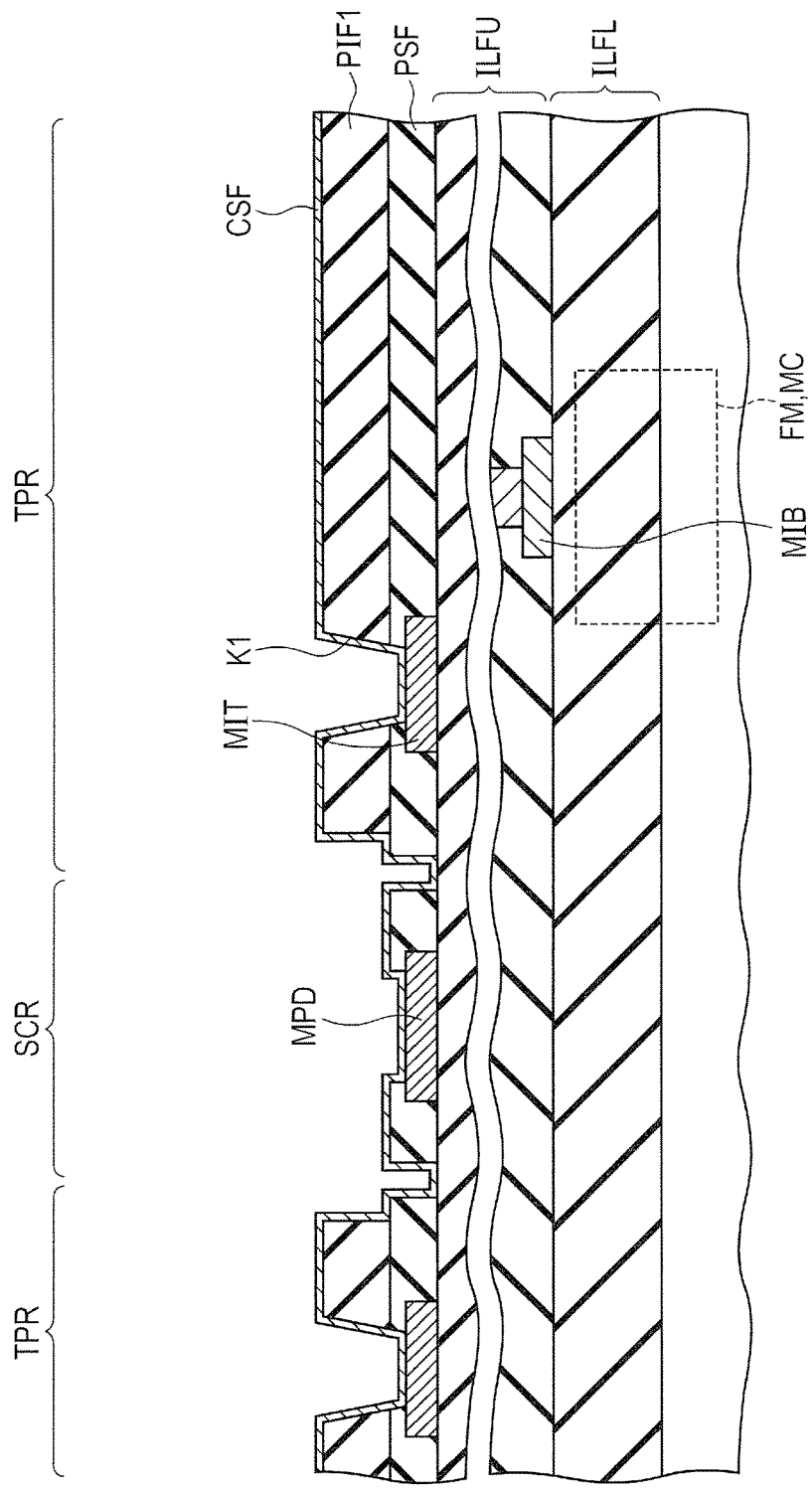
FIG. 7 is a cross-sectional view showing a step following that shown in FIG. 6 in First Embodiment.
Figure 8:
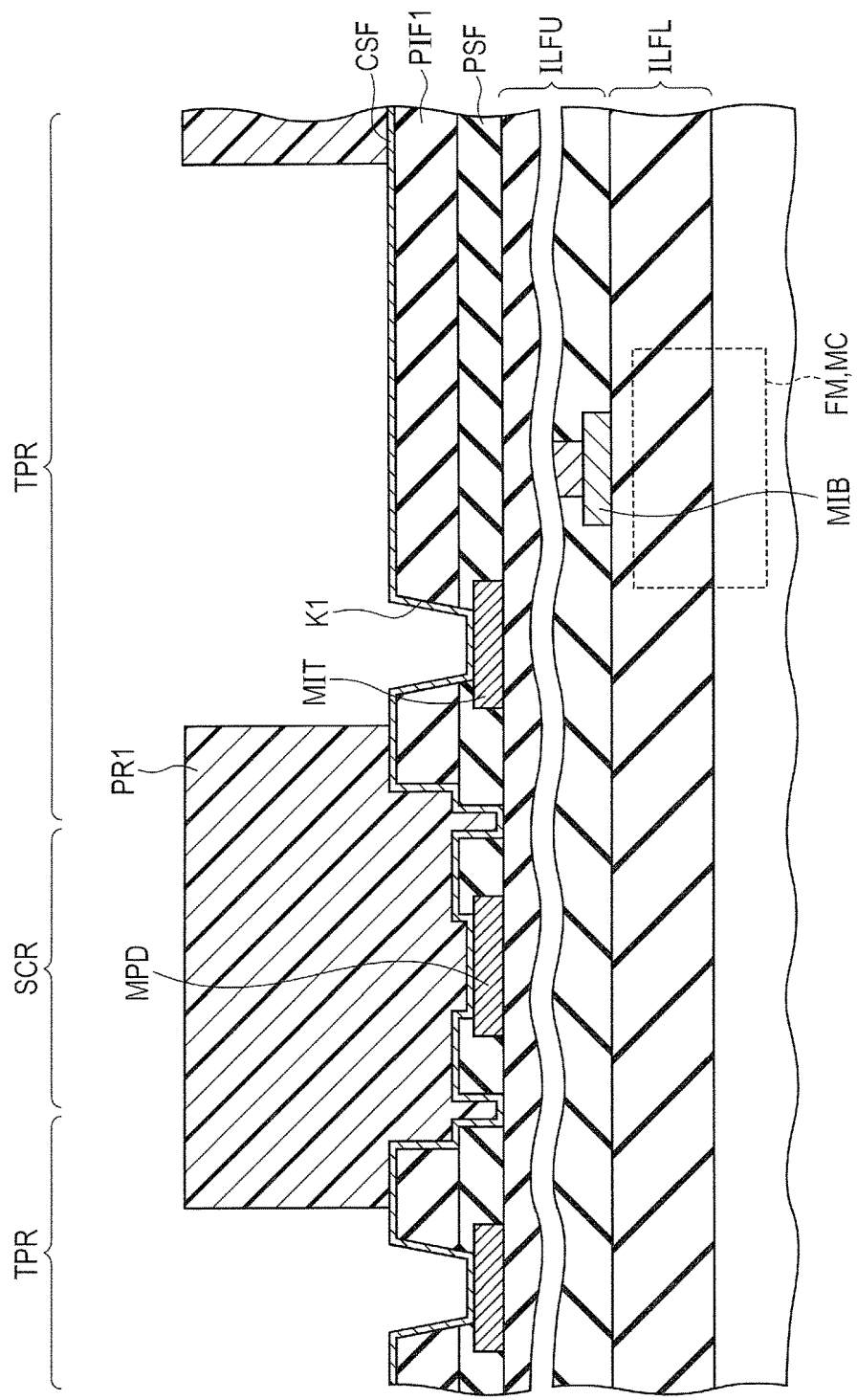
FIG. 8 is a cross-sectional view showing a step following that shown in FIG. 7 in First Embodiment.
Figure 9:
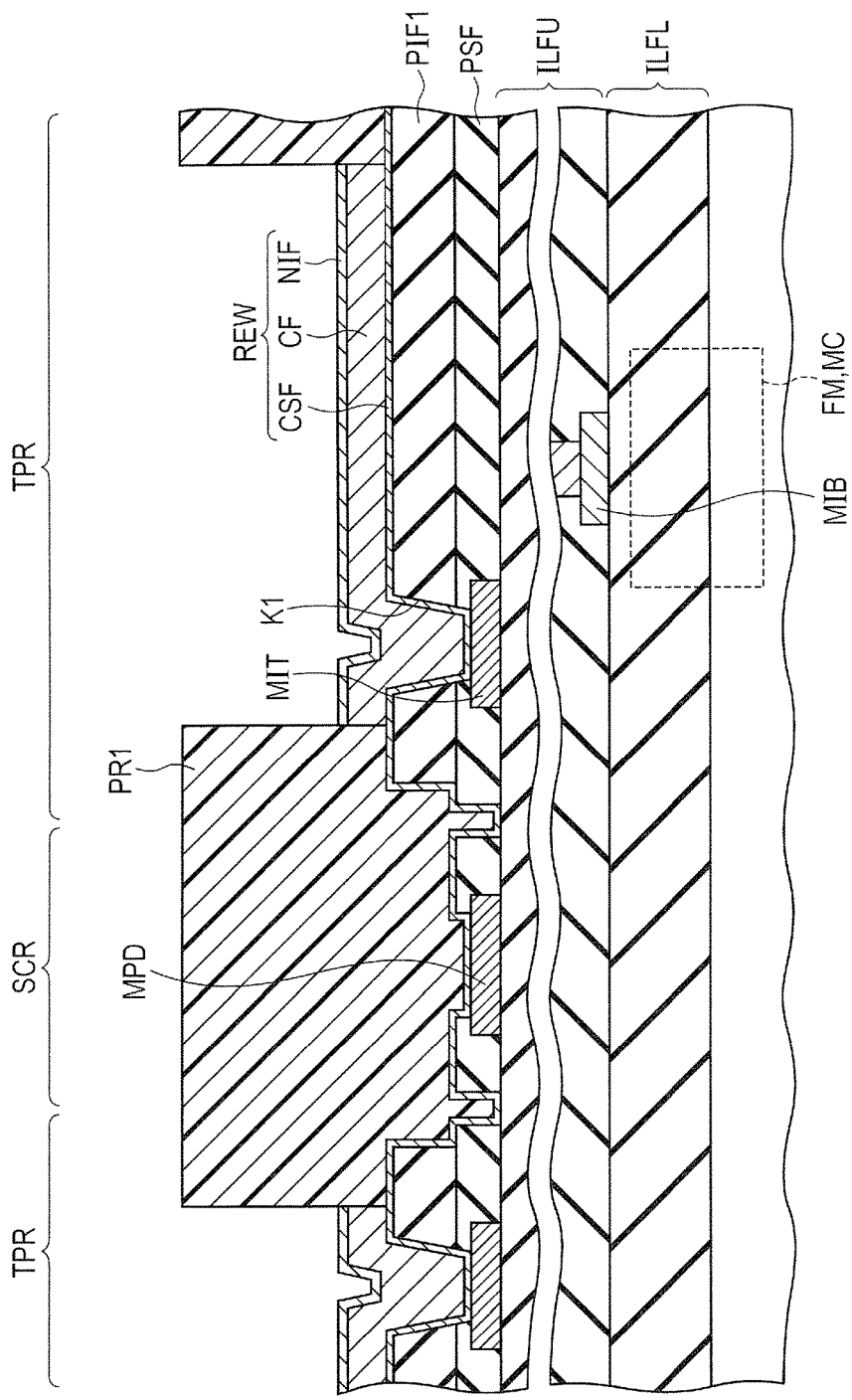
FIG. 9 is a cross-sectional view showing a step following that shown in FIG. 8 in First Embodiment.

Next, as shown in FIG. 7, a copper seed layer CSF is formed by sputtering so as to cover the respective exposed portions of the wiring layer MIF, the pad electrode MPD, and the like. Next, as shown in FIG. 8, predetermined photolithography is performed to form a photoresist pattern PR1 for the formation of a rewiring. Next, as shown in FIG. 9, a copper film CF is formed on the exposed surface of the copper seed layer CSF by electroplating of copper. Next, a nickel film NIF is formed on the surface of the copper film CF by electroplating of nickel. Then, the photoresist pattern PR1 is removed.

Figure 10:
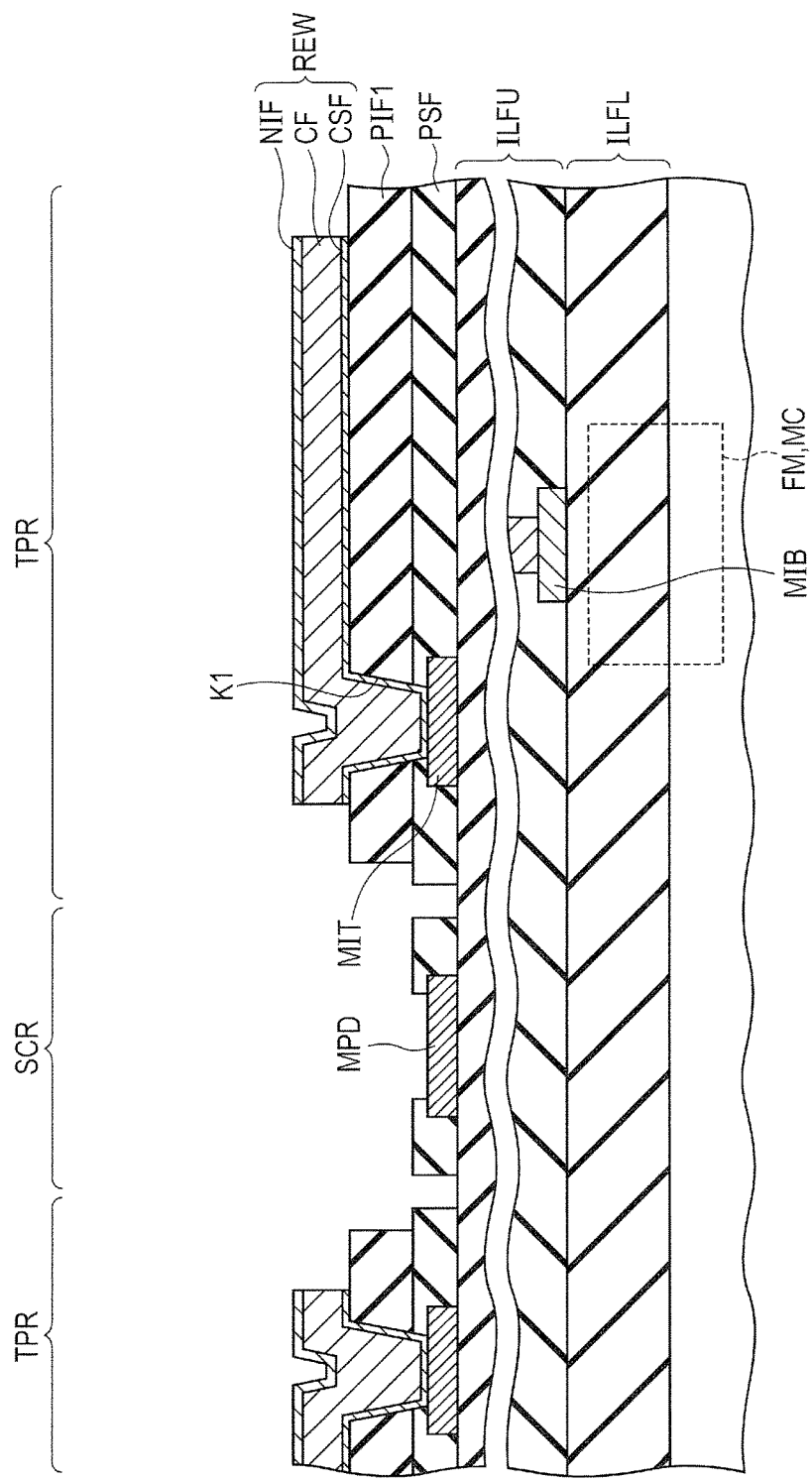
FIG. 10 is a cross-sectional view showing a step following that shown in FIG. 9 in First Embodiment.

Next, as shown in FIG. 10, by removing an exposed portion of the copper seed layer CSF, the rewiring REW is exposed in the chip region TPR. The rewiring REW is coupled to the wiring layer MIT via the opening portion K1. In the scribe region SCR, on the other hand, the pad electrode MPD is exposed.

Figure 11:
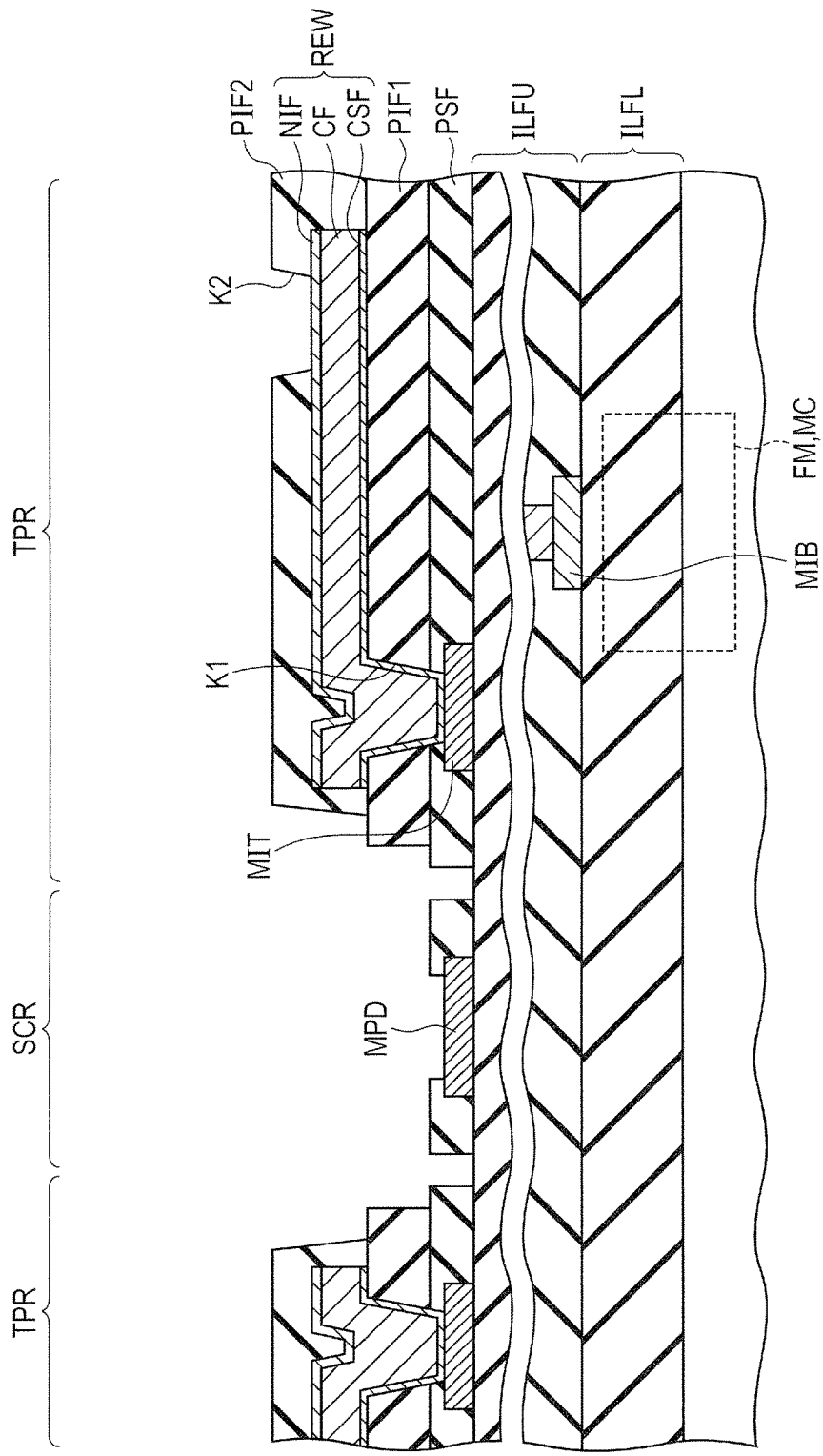
FIG. 11 is a cross-sectional view showing a step following that shown in FIG. 10 in First Embodiment.

Next, as shown in FIG. 11, polyimide is applied so as to cover the rewiring REW and the like. By predetermined photolithography and etching, a polyimide film PIF2 is formed. In the chip region TPR, an opening portion K2 is formed in the polyimide film PIF2 and the surface of the rewiring REW is exposed. In the scribe region SCR, on the other hand, the polyimide film is removed and the pad electrode MPD is exposed.

Figure 12:
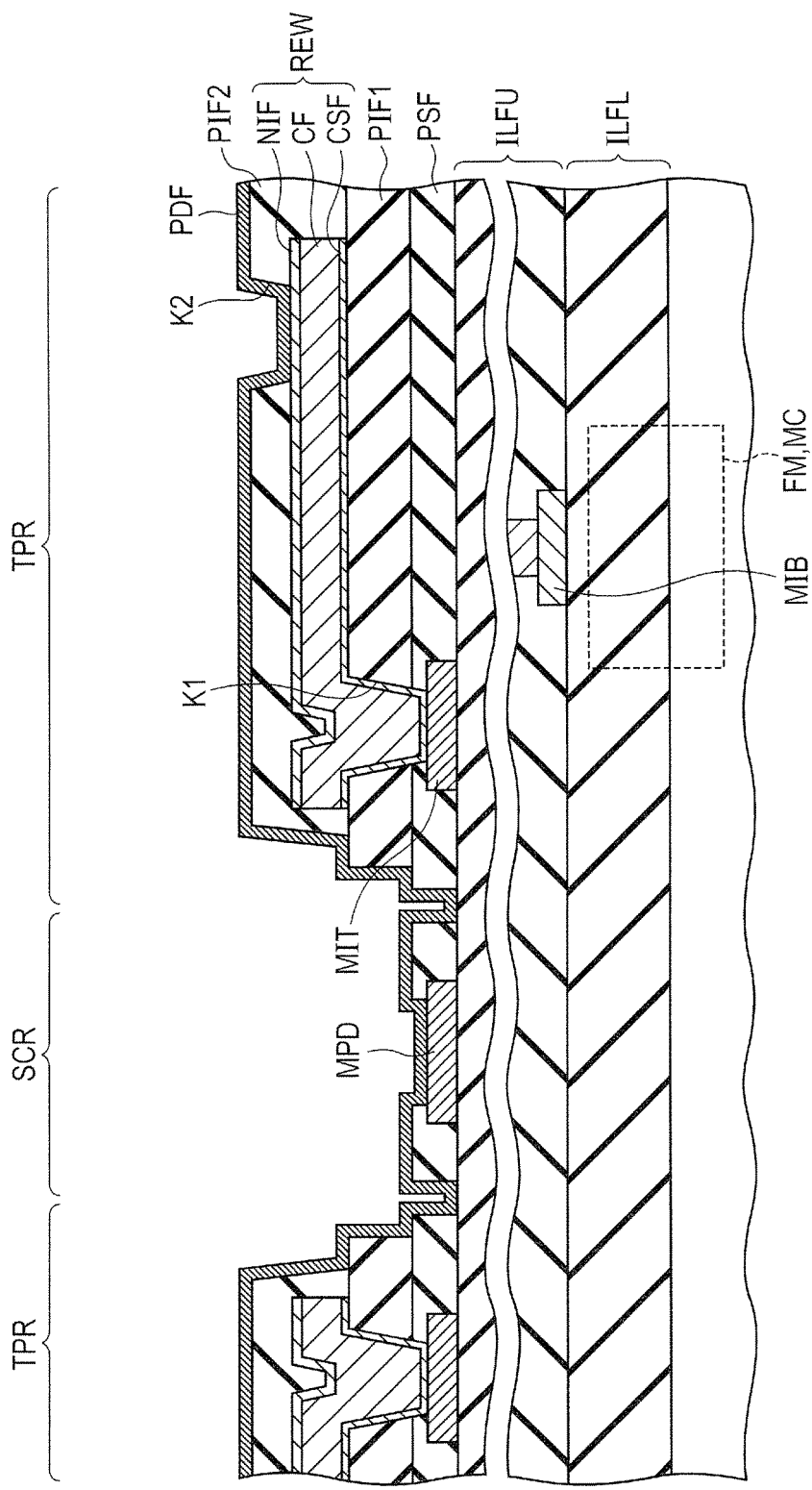
FIG. 12 is a cross-sectional view showing a step following that shown in FIG. 11 in First Embodiment.
Figure 13:
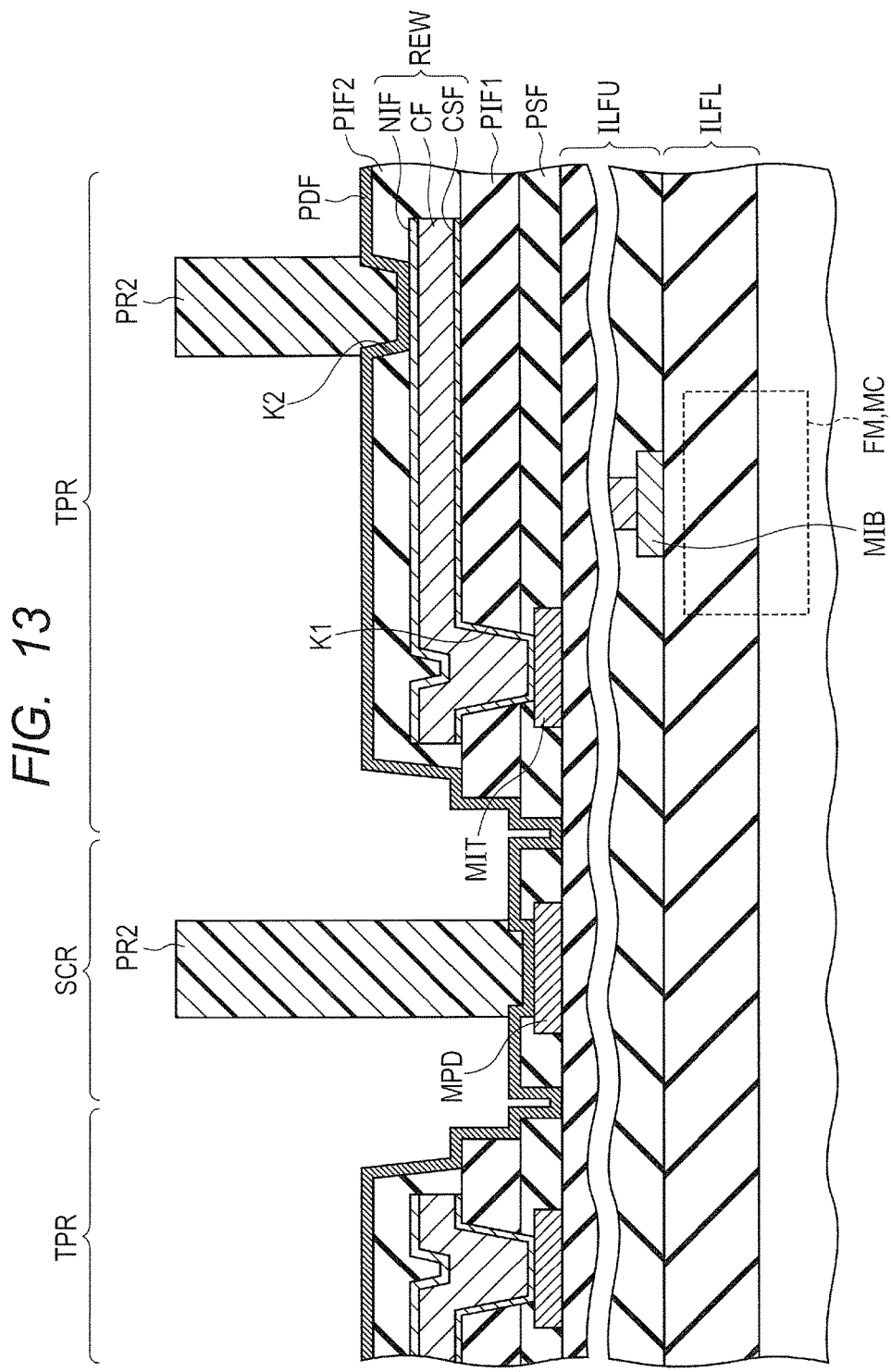
FIG. 13 is a cross-sectional view showing a step following that shown in FIG. 12 in First Embodiment.

Next, as shown in FIG. 12, a palladium film PDF is formed by sputtering so as to cover the respective exposed portions of the rewiring REW, the pad electrode MPD, and the like. Next, as shown in FIG. 13, by predetermined photolithography, a photoresist pattern PR2 is formed. In the chip region TPR, the photoresist pattern PR2 is formed so as to cover a portion of the palladium film PDF contiguous to the rewiring REW. In the scribe region SCR, the photoresist pattern PR2 is formed so as to cover a portion of the palladium film PDF contiguous to the pad electrode MPD.

Figure 14:
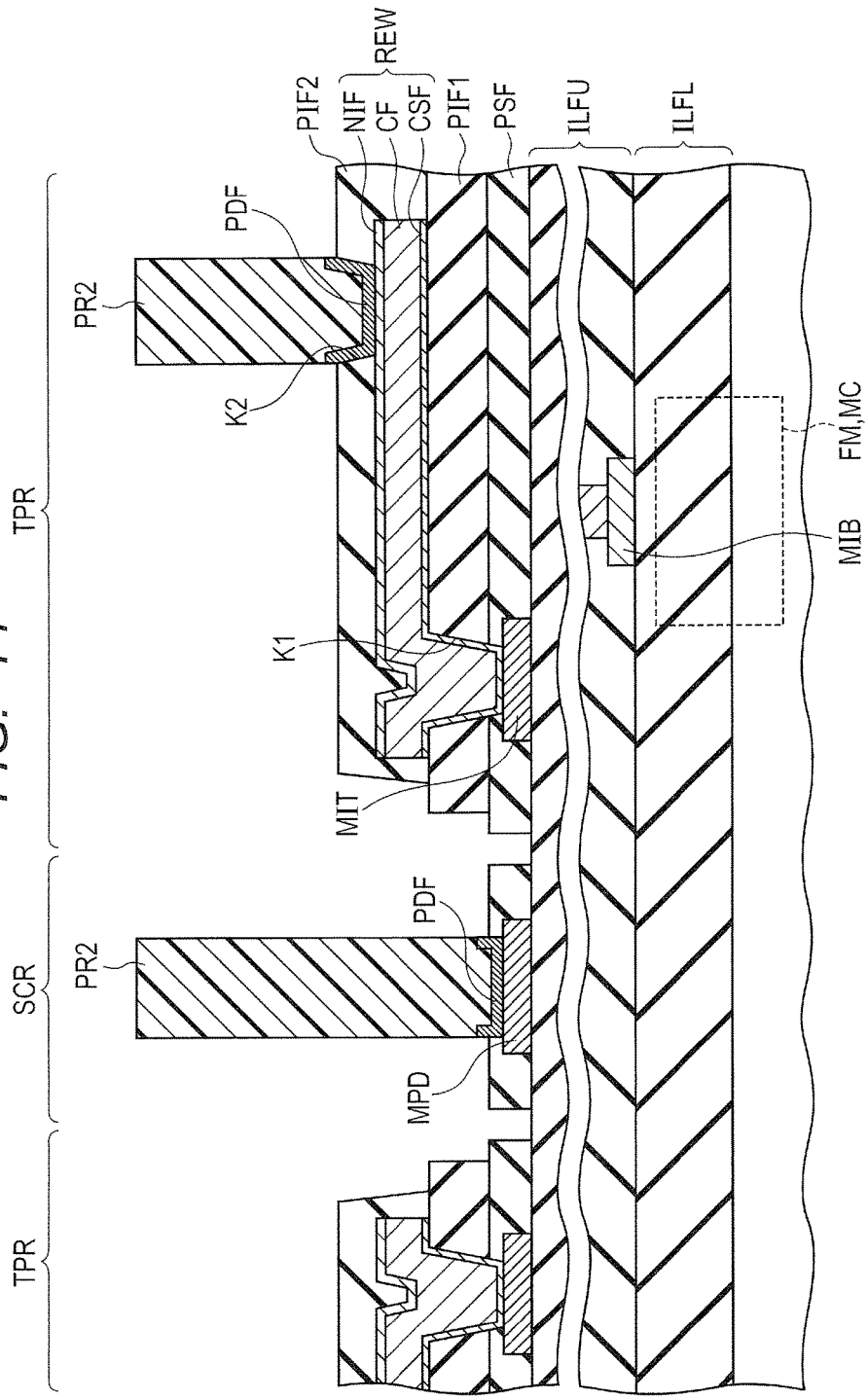
FIG. 14 is a cross-sectional view showing a step following that shown in FIG. 13 in First Embodiment.
Figure 15:
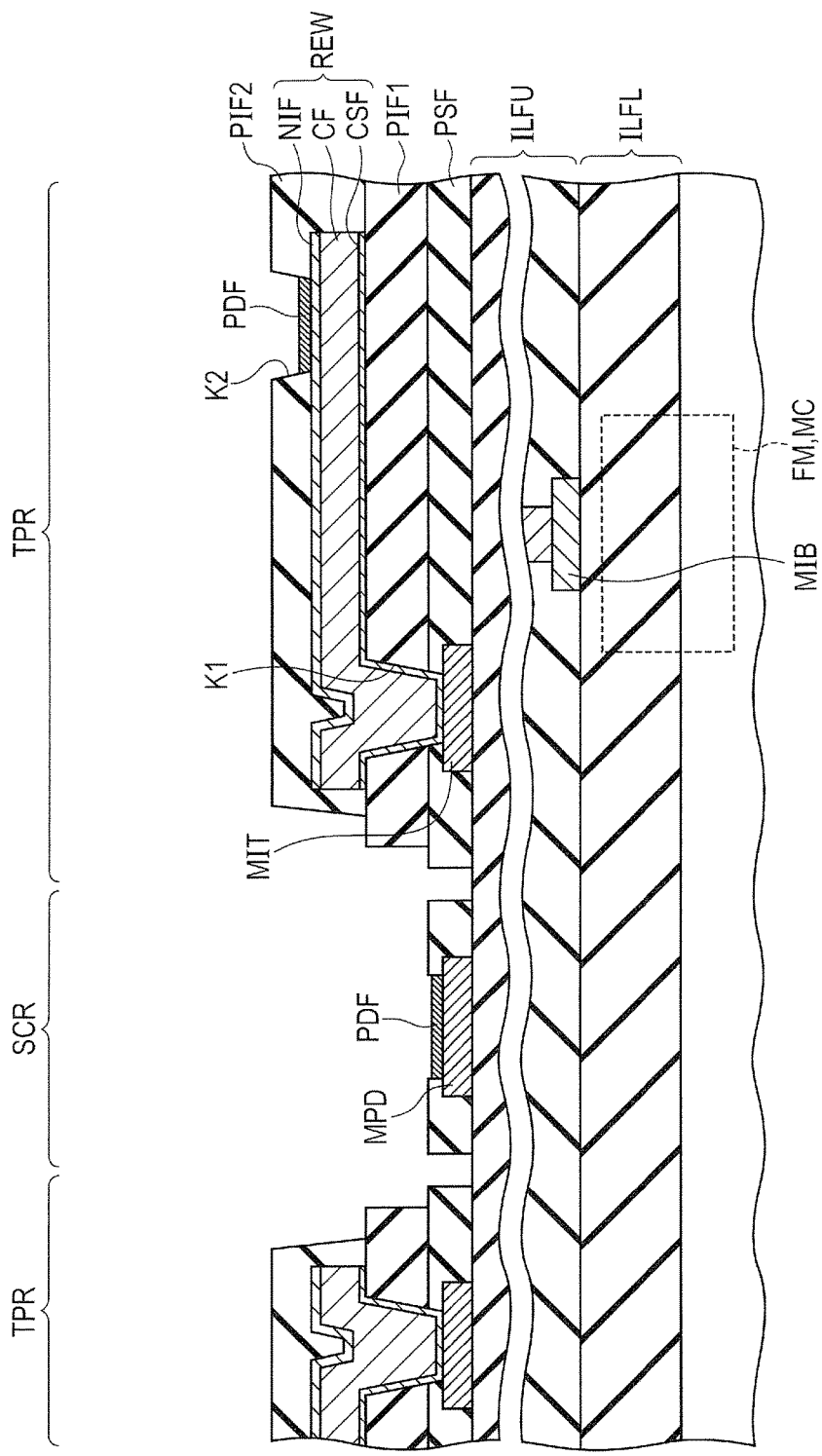
FIG. 15 is a cross-sectional view showing a step following that shown in FIG. 14 in First Embodiment.

Next, as shown in FIG. 14, with the photoresist pattern PR2 as an etching mask, an exposed portion of the palladium film PDF is removed using a predetermined chemical solution (iodine). During this etching, the pad electrode MPD covered with the palladium film PDF and the photoresist pattern PR2 is prevented from being exposed to the chemical solution. Next, as shown in FIG. 15, the photoresist pattern PR2 is removed and the remaining palladium film PDF is exposed.

Figure 16:
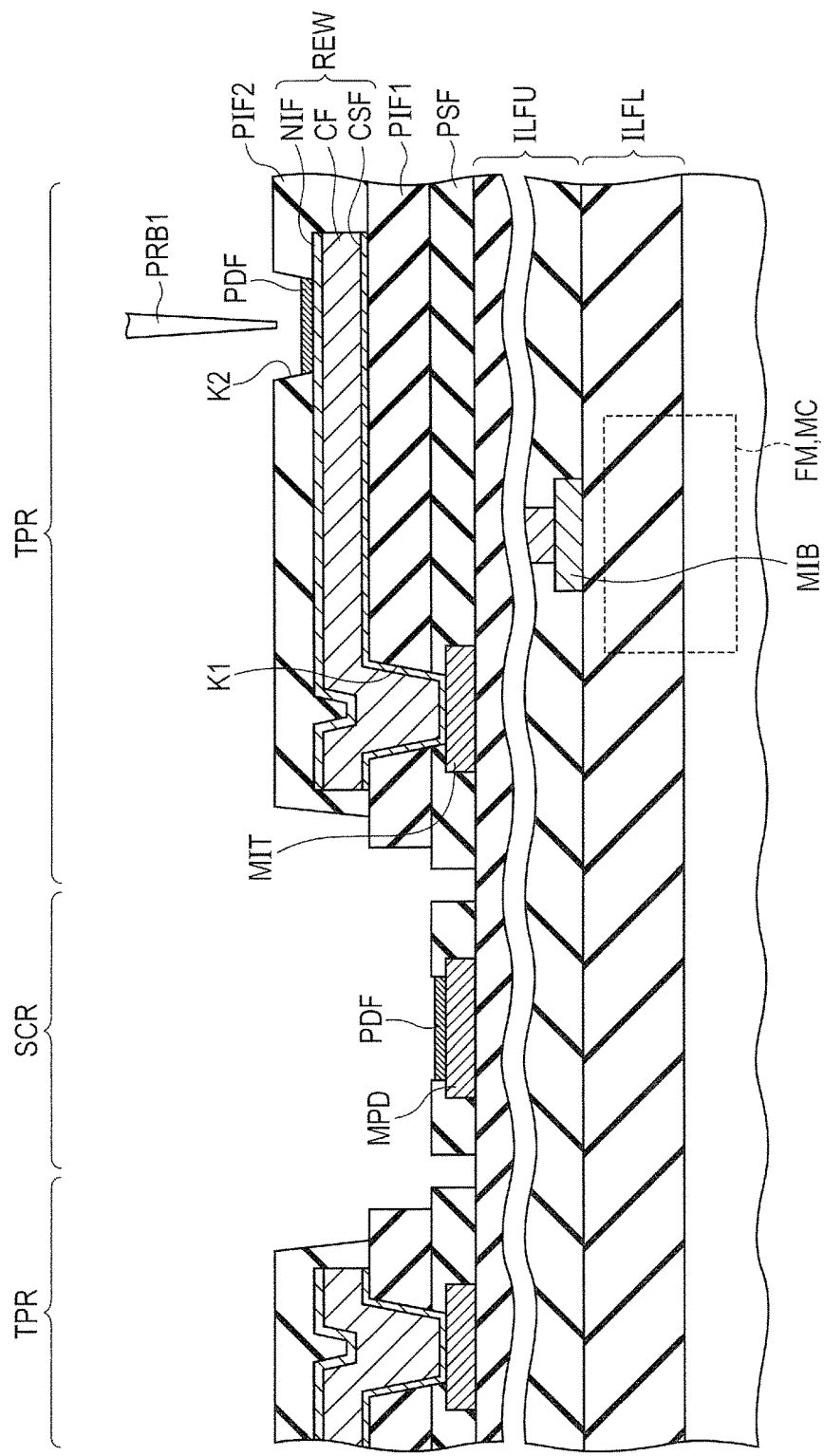
FIG. 16 is a cross-sectional view showing a step following that shown in FIG. 15 in First Embodiment.

Next, the flash memory as a semiconductor element receives a probe test. As shown in FIG. 16, a probe needle PRB1 is brought into contact with the palladium film PDF that covers the rewiring REW and data are written into the memory cell MC of the flash memory FM. For example, predetermined voltages are applied to the control gate electrode CG, the memory gate electrode MG, the source region SR, the drain region DR, and the like, respectively as shown in FIG. 3 to accumulate charges as data in an insulating film ONO (silicon nitride film) (source side injection).

Next, the wafer (semiconductor substrate) having the flash memory into which data have been written is heat treated (baked at 250° C. for 12 hours). This heat treatment is called "retention baking". After this heat treatment, a retention test is performed to know whether or not the data written into the flash memory has been retained. Predetermined voltages, different from those at the time of writing, are applied, respectively, to the control gate electrode CG, the memory gate electrode MG, the source region SR, the drain region DR, and the like as shown in FIG. 3.

When a threshold voltage of the transistor including a memory gate electrode MG is higher than a predetermined voltage, it is determined that data written into the flash memory has been retained. When the threshold voltage is lower than the predetermined voltage, on the other hand, it is determined that the data written into the flash memory has disappeared. A series of heat treatment and data reading steps are repeated a plurality of times as needed.

Figure 17:
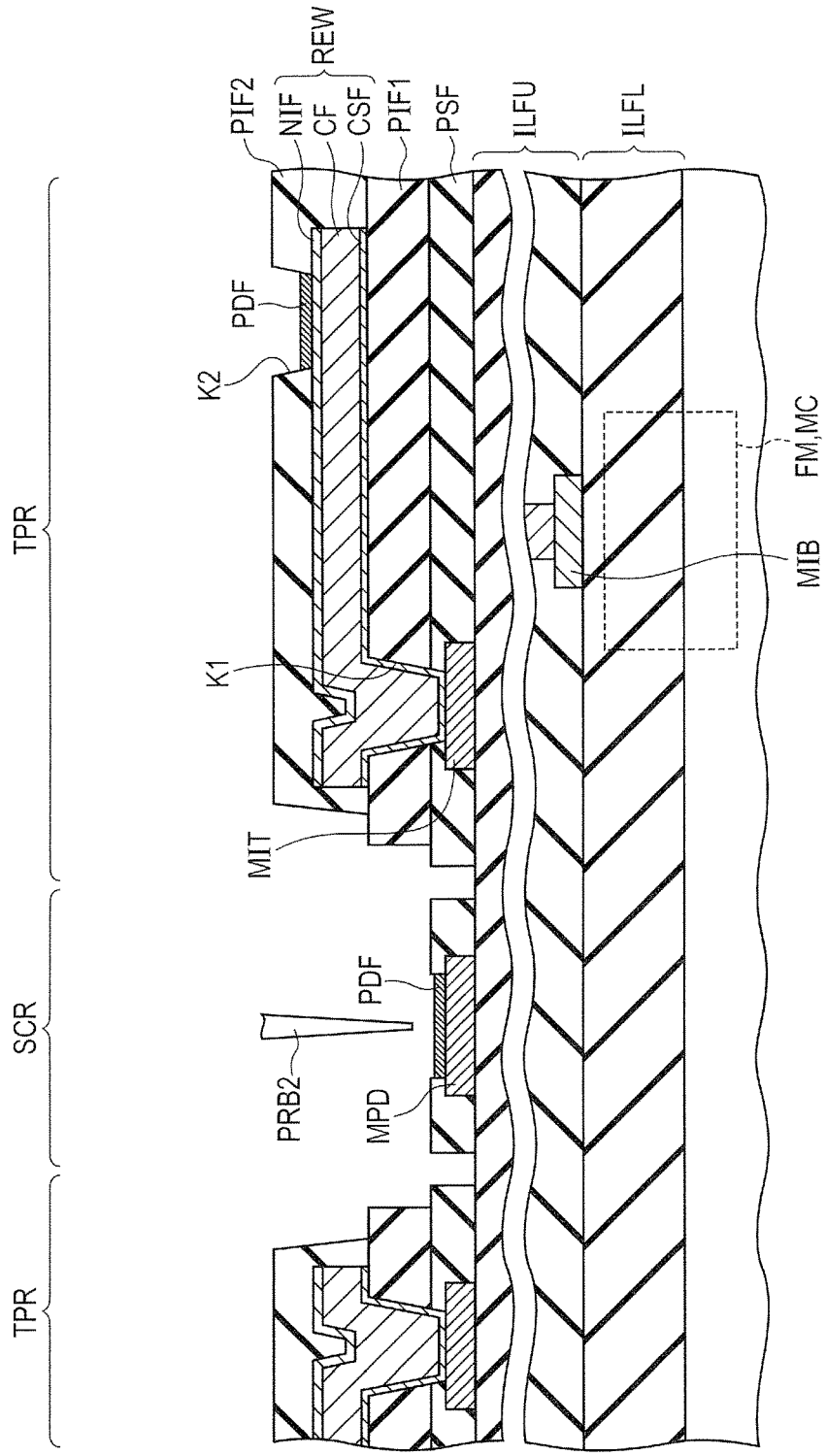
FIG. 17 is a cross-sectional view showing a step performed in combination with the step shown in FIG. 16 in First Embodiment.

While the series of steps are repeated, the palladium film PDF that covers the pad electrode MPD is exposed in the scribe region SCR. This makes it possible to simultaneously carry out a test of a test element group (not shown) formed in the scribe region SCR. For example, after data from the flash memory are read, the electrical characteristics and the like of the test element group formed in the scribe region SCR can be evaluated by bringing the probe needle PRB2 into contact with the palladium film PDF as shown in FIG. 17.

Figure 18:
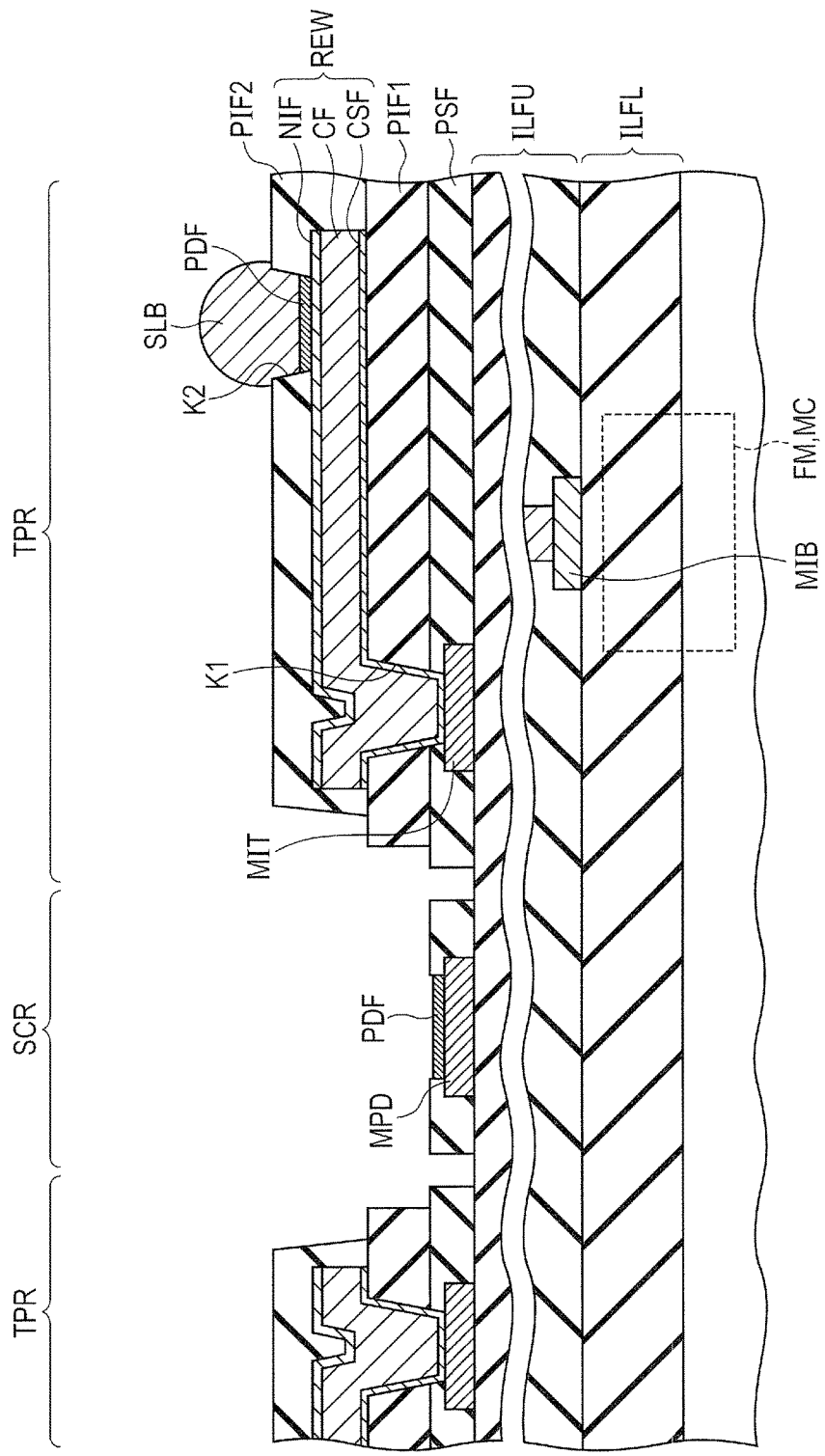
FIG. 18 is a cross-sectional view showing a step performed after the steps shown in FIGS. 16 and 17 in First Embodiment.

After completion of a series of the probe test of the flash memory and the test of the test element group, a solder ball SLB is coupled to the palladium film PDF that covers the rewiring REW, as shown in FIG. 18. Then, visual inspection, shear test of the solder ball SLB, and the like are performed. The wafer is then divided into individuals by dicing in the scribe region SCR. In such a manner, the main portion of the semiconductor device as shown in FIG. 2 is completed.

In the above-described method of manufacturing a semiconductor device, the palladium film PDF formed on the surface of the rewiring REW (nickel film NIF) to which the solder ball is to be coupled can prevent deposition of nickel in the nickel film NIF and maintain wetness of solder. This will be described below, compared with a semiconductor device of Comparative Example. Members similar to those of the semiconductor device of First Embodiment will be identified by the same reference numerals and a description on them will not be repeated unless otherwise necessary.

Figure 19:
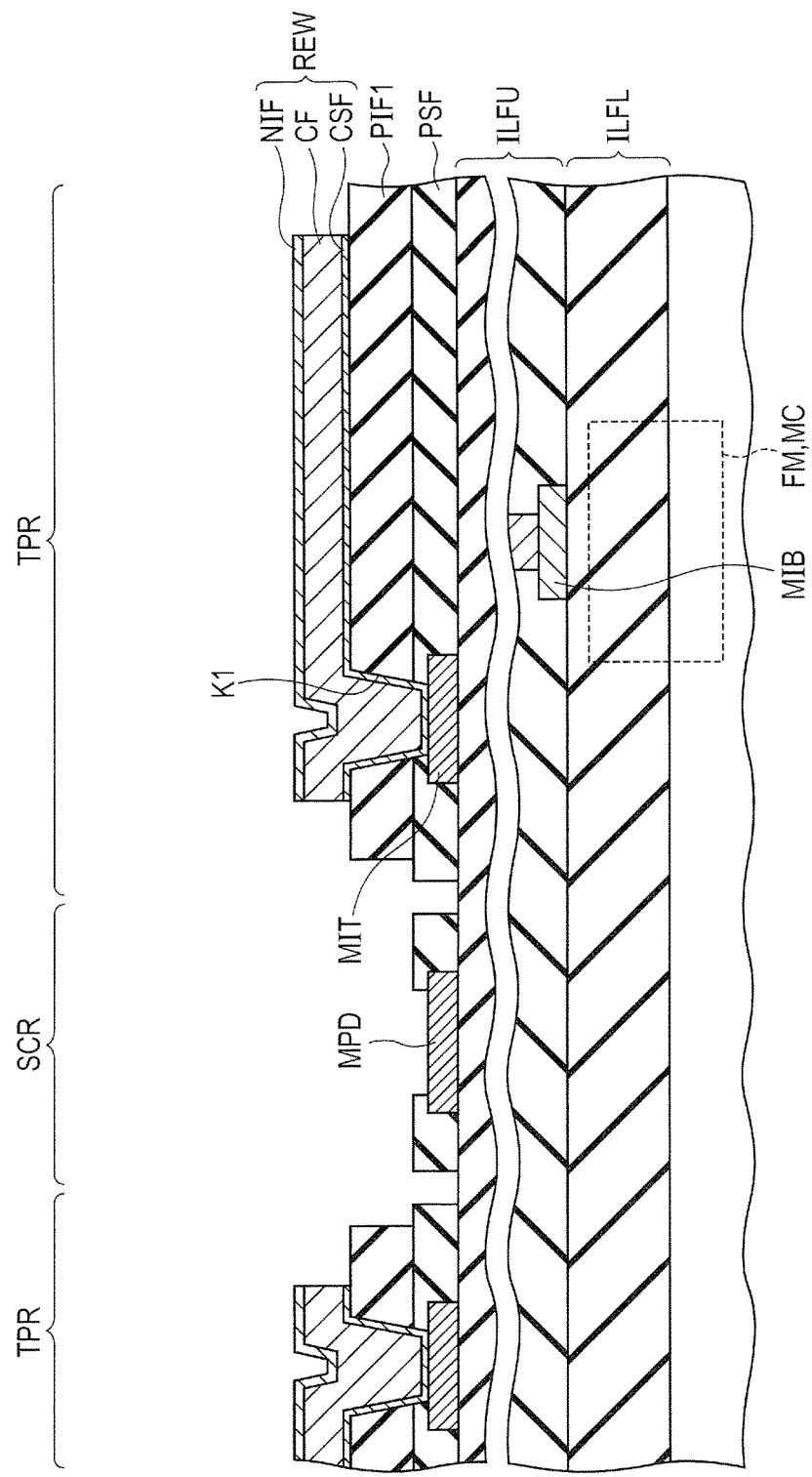
FIG. 19 is a cross-sectional view showing one step of a method of manufacturing a semiconductor device according to Comparative Example.

The semiconductor device of Comparative Example is manufactured first by performing steps similar to those shown in FIGS. 6 to 10 to form a copper rewiring REW as shown in FIG. 19. Then, polyimide is applied so as to cover the rewiring REW and the like. By predetermined photolithography and etching, a polyimide film PIF2 is formed. In the chip region TPR, an opening portion K2 is made in the polyimide film PIF2 to expose the surface of the rewiring REW (nickel film NIF). In the scribe region SCR, on the other hand, a polyimide film PIF2 is formed so as to cover the pad electrode MPD.

Figure 21:
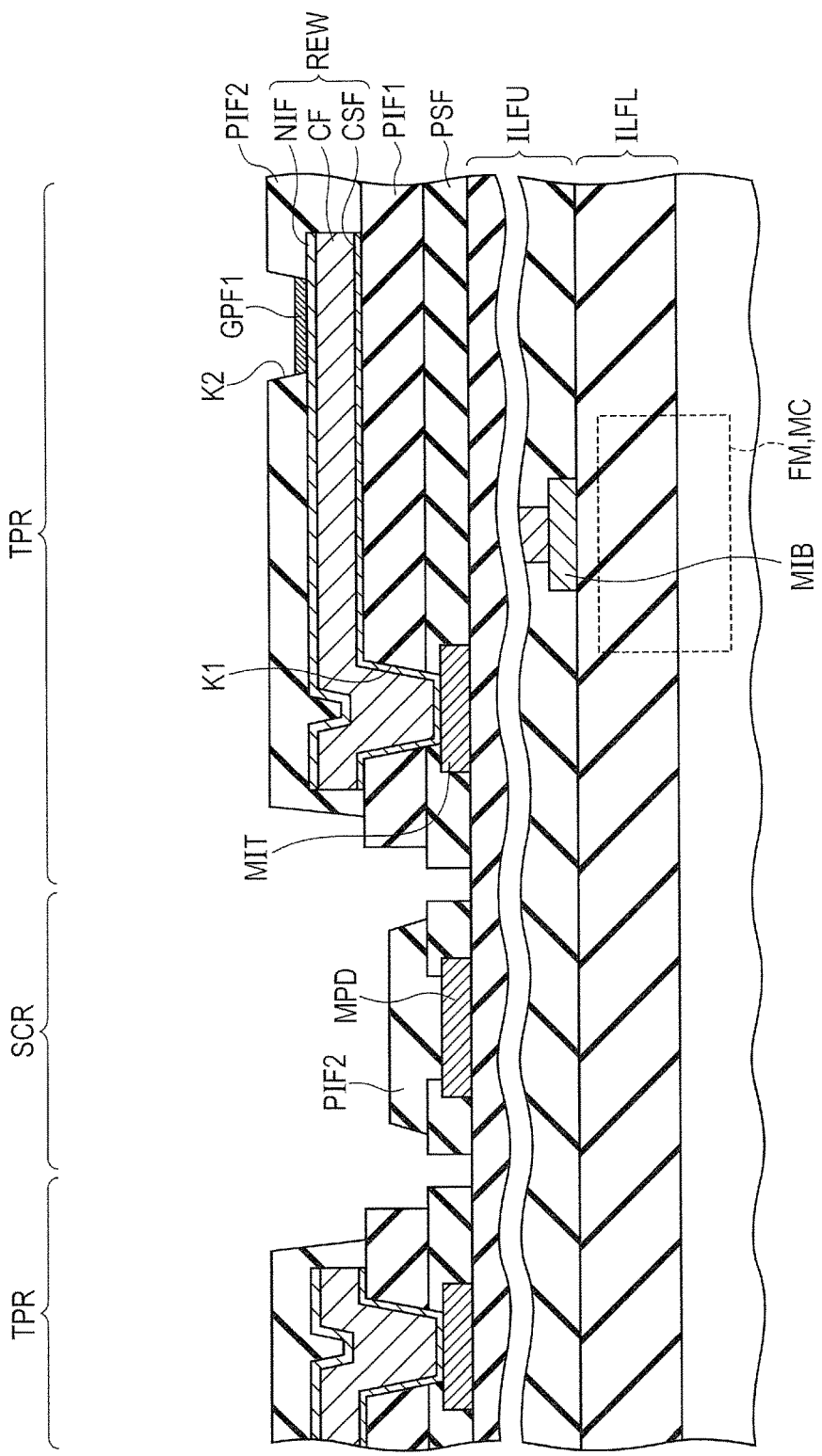
FIG. 21 is a cross-sectional view showing a step following that shown in FIG. 20.
Figure 22:
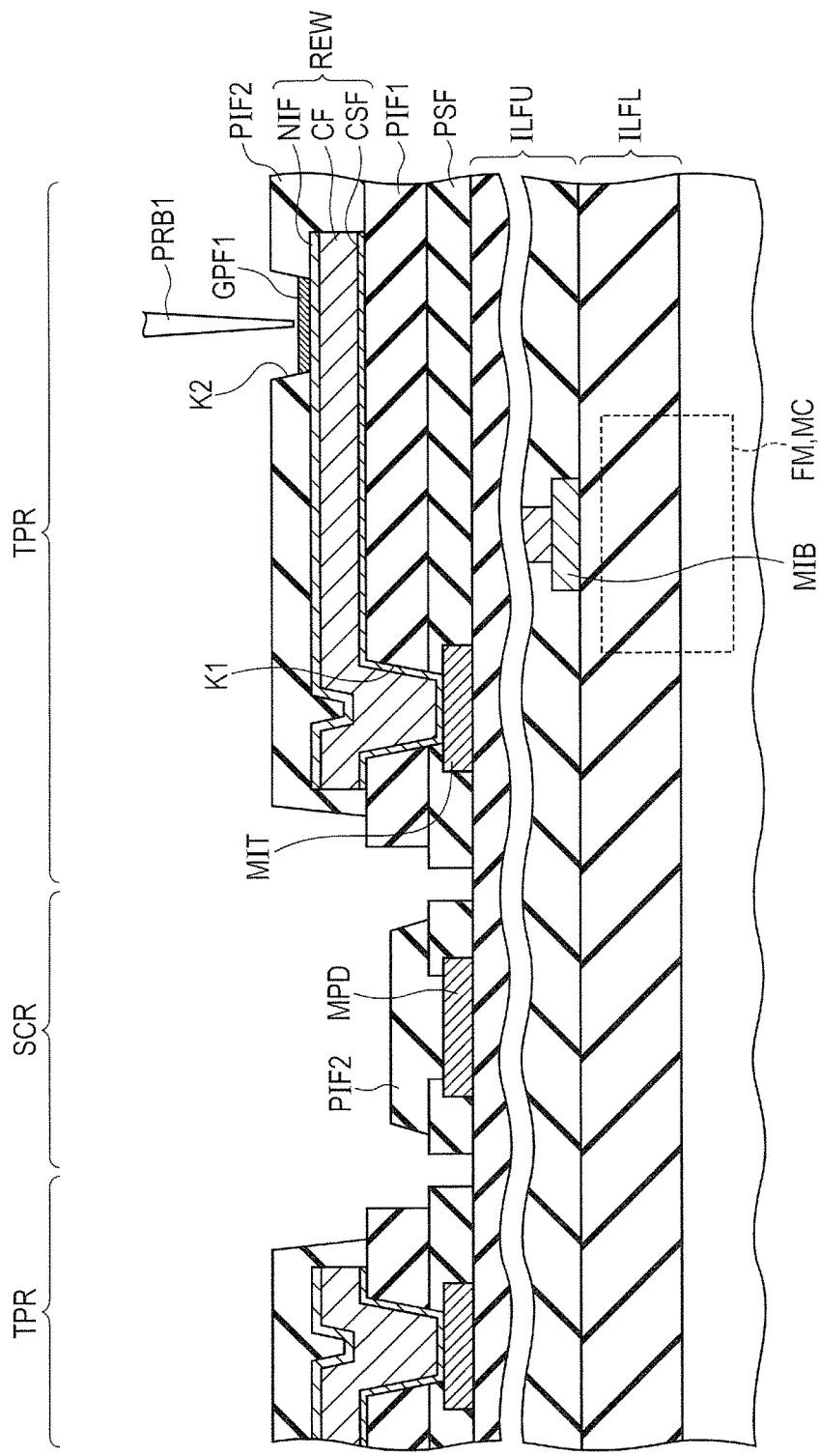
FIG. 22 is a cross-sectional view showing a step following that shown in FIG. 21.

Next, substitution gold plating is performed to cause a substitution reaction between nickel and gold on the exposed surface of the nickel film NIF and thereby form a gold film GPF1 as shown in FIG. 21. Next, the flash memory FM is subjected to a probe test. As shown in FIG. 22, a probe needle PRB1 is brought into contact with the gold film GPF1 that covers the rewiring REW to write data into the memory cell MC of the flash memory FM.

Figure 23:
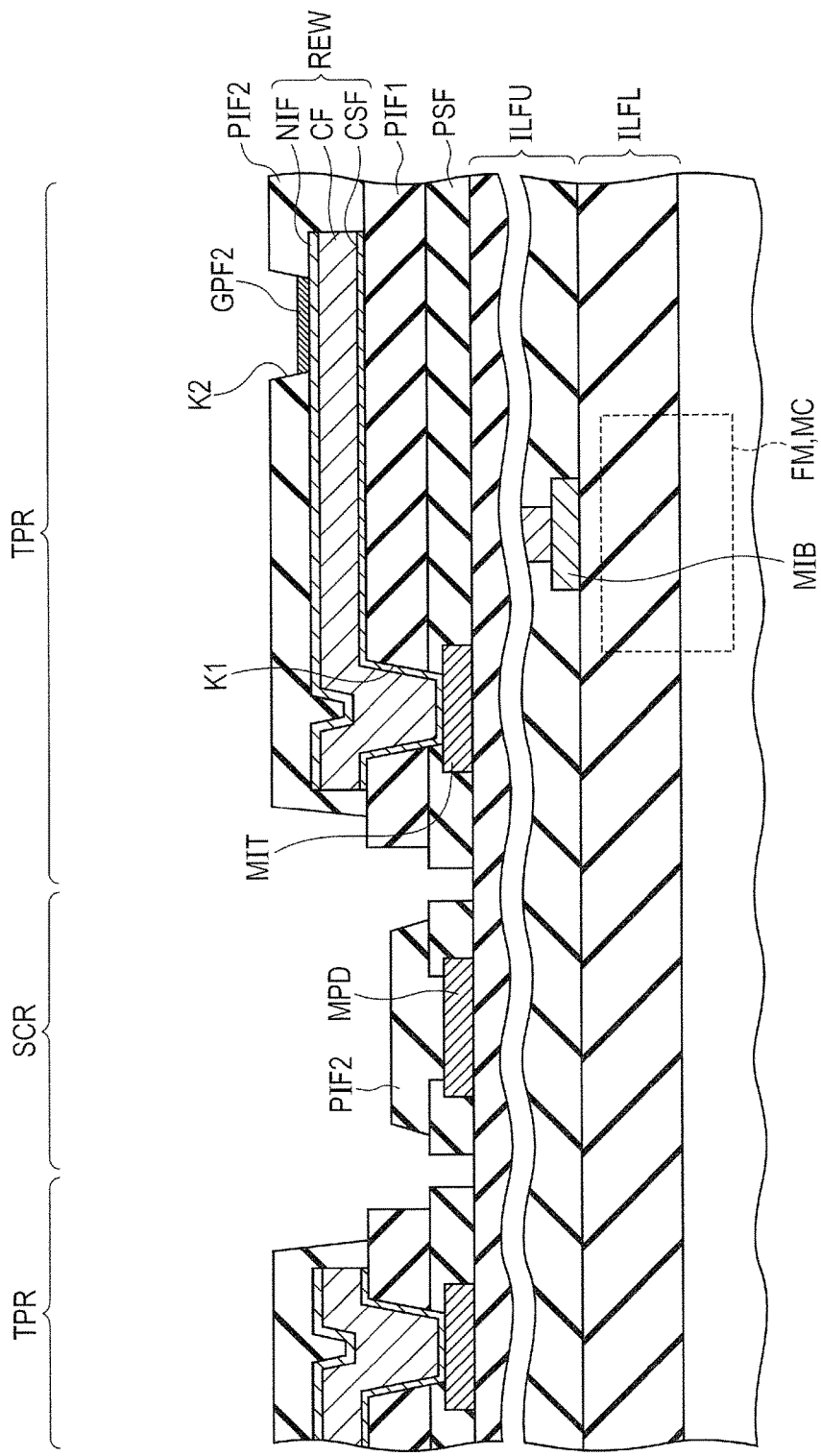
FIG. 23 is a cross-sectional view showing a step following that shown in FIG. 22.

Next, the wafer (semiconductor substrate) having the flash memory into which data have been written is subjected to heat treatment (baking at 250° C. for 12 hours). This heat treatment may cause deposition of nickel on the surface of the gold film GPF1. Next, substitution gold plating is performed again to form a gold film GPF2 as shown in FIG. 23.

Figure 24:
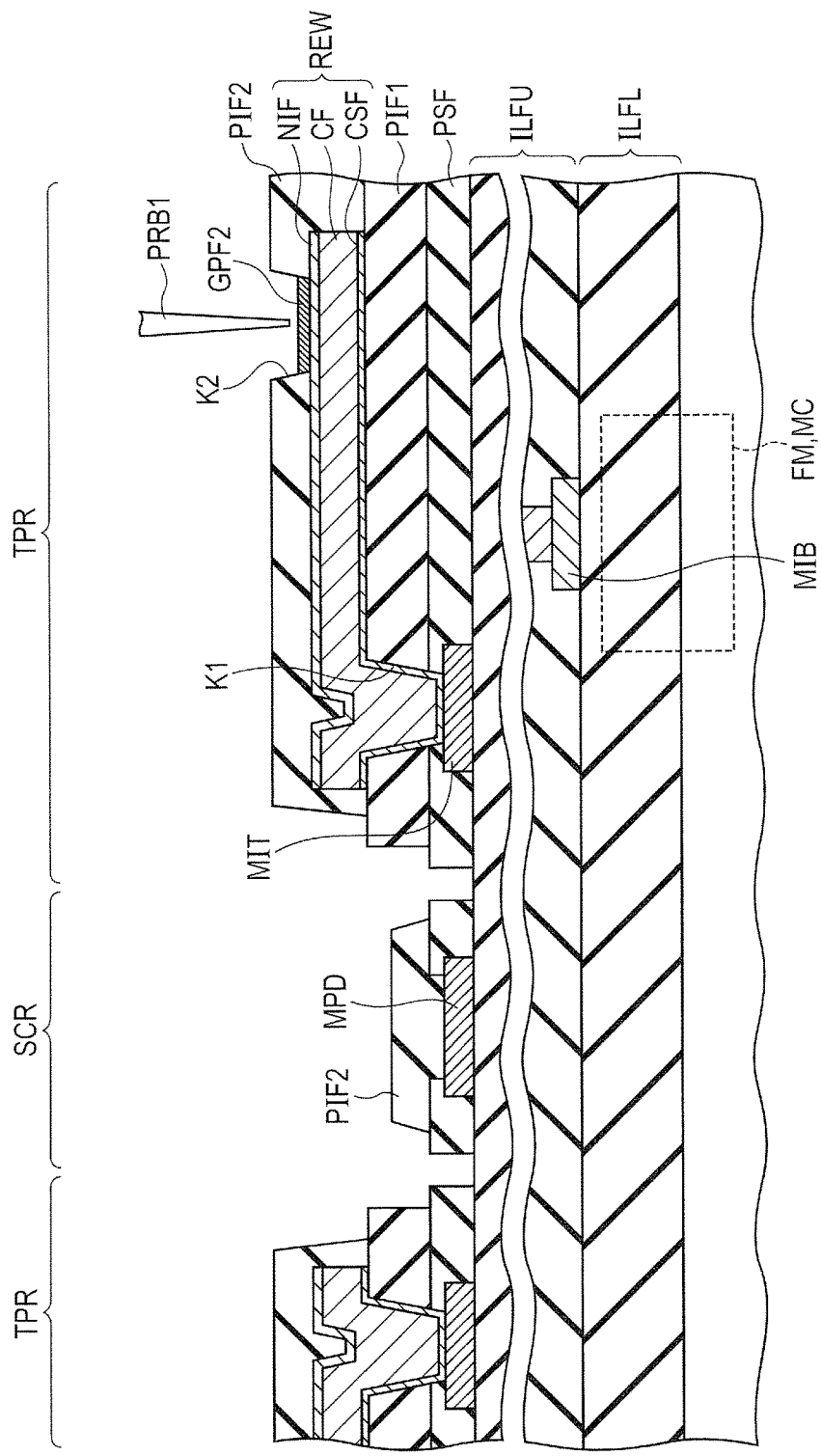
FIG. 24 is a cross-sectional view showing a step following that shown in FIG. 23.
Figure 25:
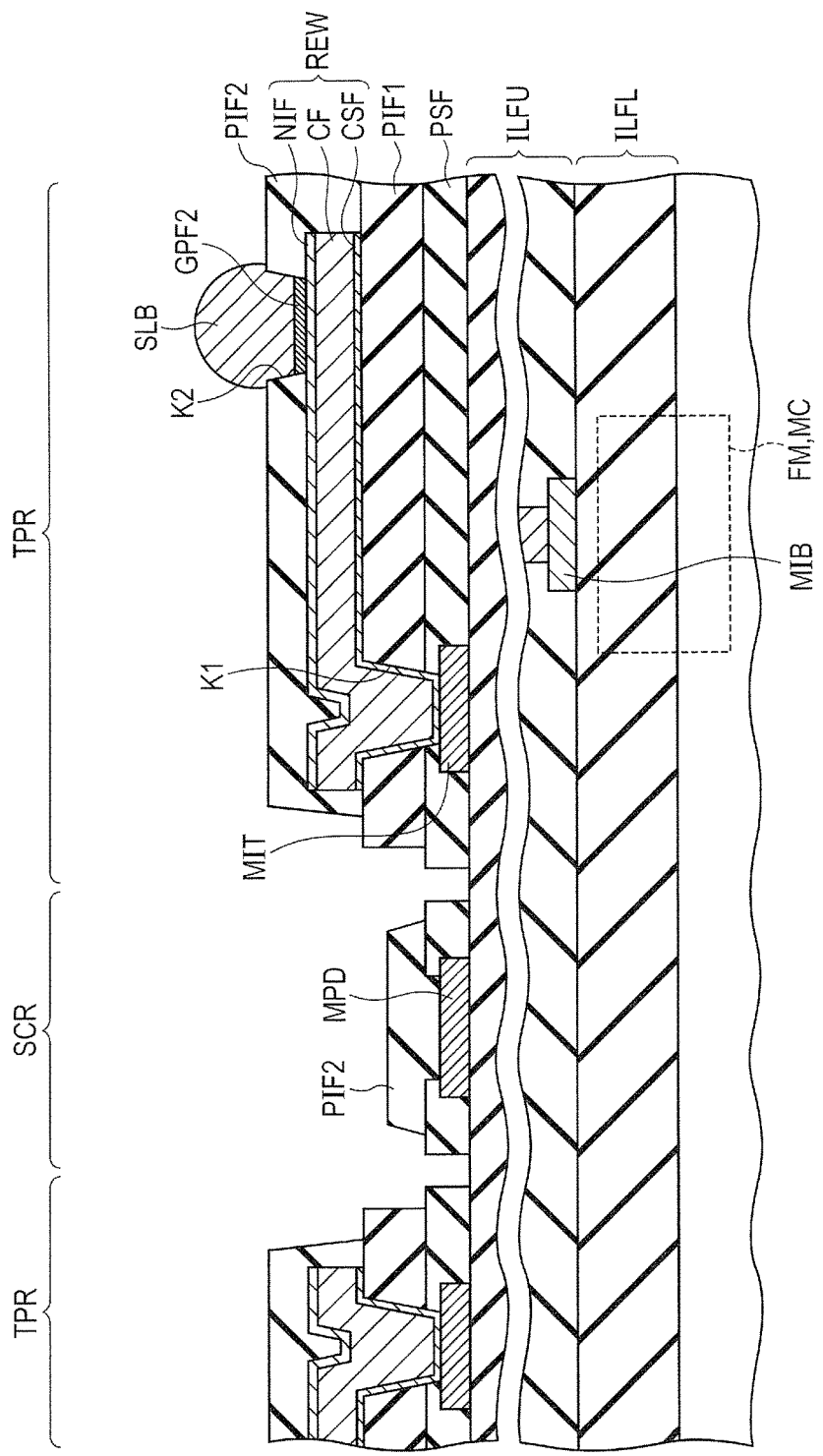
FIG. 25 is a cross-sectional view showing a step following that shown in FIG. 24.

Next, as shown in FIG. 24, the probe needle PRB1 is brought into contact with the gold film GPF2 to perform a retention test to determine whether or not the data written into the flash memory FM has been retained. After completion of the probe test of the flash memory FM, a solder ball SLB is coupled to the gold film GPF2 that covers the rewiring REW, as shown in FIG. 25. Then, visual inspection and the like are performed and the wafer is divided into individuals by dicing in the scribe region. The main portion of the semiconductor device of Comparative Example is thus completed.

Figure 26:
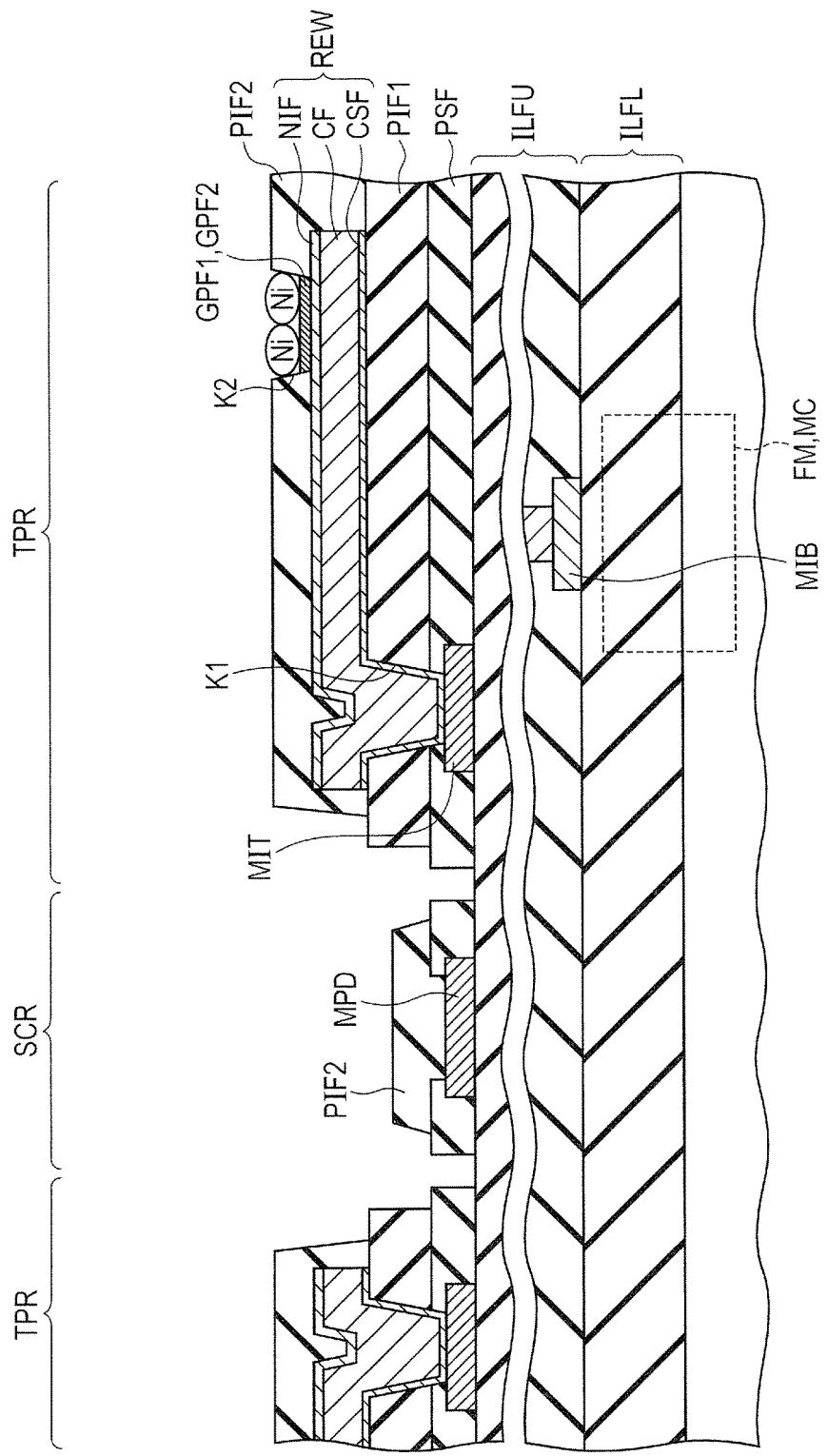
FIG. 26 is a first cross-sectional view showing a problem of the semiconductor device according to Comparative Example.

As described above, in the semiconductor device of Comparative Example, heat treatment (retention baking) in the memory retention test may cause deposition of nickel on the surface of the gold film GPF1 as shown in FIG. 26. The present inventors have found that deposition of nickel deteriorates the wetness of solder, leading to a problem that during coupling of the solder ball SLB, the solder ball SLB is not reliably coupled to the gold film GPF1. In addition, formation of the gold film PDF2 in order to maintain the wetness of solder requires addition of a step therefor, causing one of the factors inhibiting step reduction.

Further, the present inventors have revealed that in the semiconductor device of Comparative Example, formation of the gold film GP1 by substitution gold plating may cause a new problem in the scribe region SCR. This problem is next described. The scribe region SCR has therein the pad electrode MPD (refer to FIG. 19). This pad electrode MPD is comprised mainly of aluminum.

Figure 20:
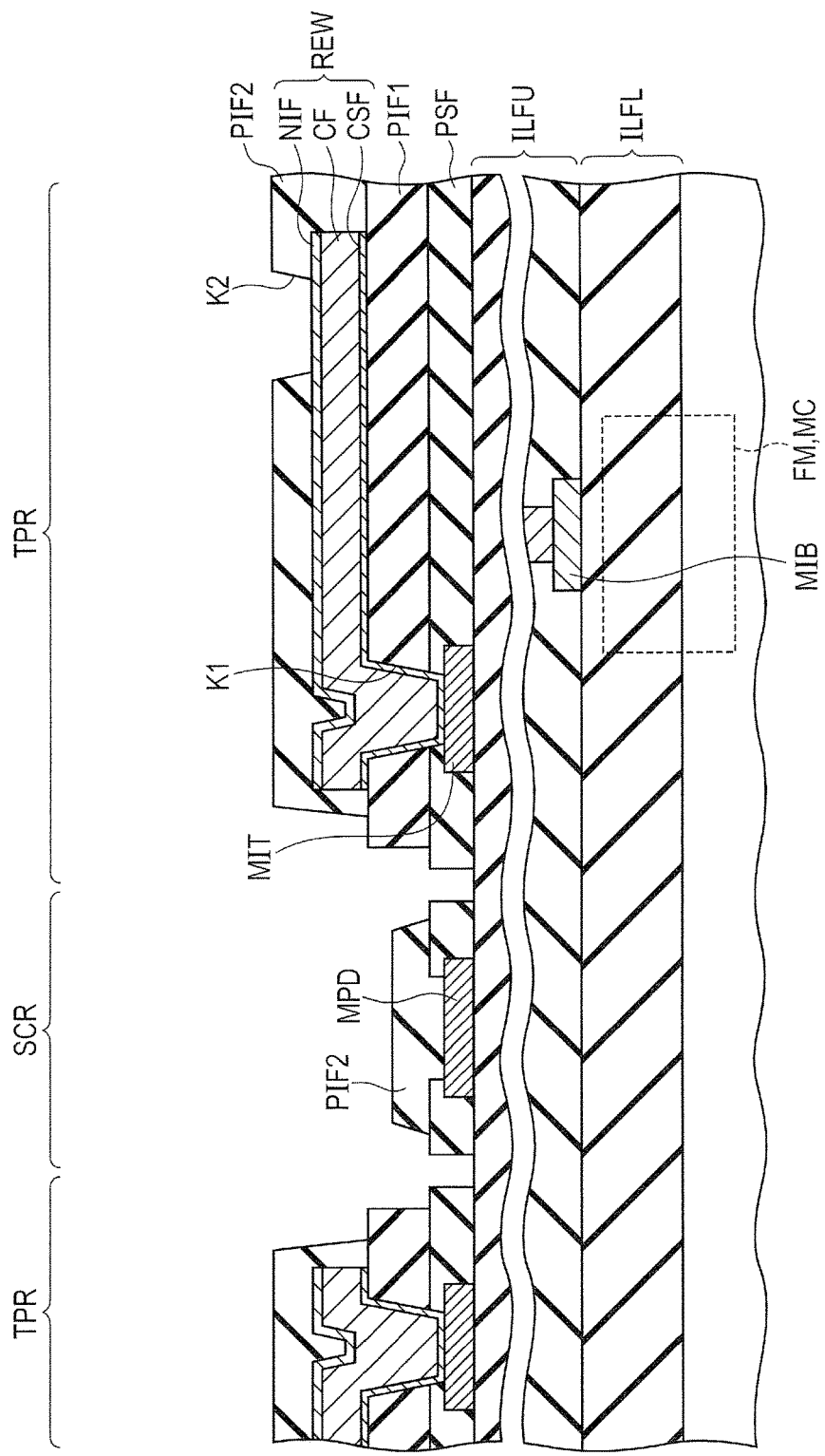
FIG. 20 is a cross-sectional view showing a step following that shown in FIG. 19.

When the gold film GPF1 is formed on the surface of the nickel film NIF (rewiring REW) by substitution gold plating, corrosion of aluminum occurs in the pad electrode MPD due to cell action between different metals, that is, nickel and aluminum. The pad electrode MPD is required to be covered with the polyimide film PIF1 in advance when substitution gold plating is performed (refer to FIG. 20).

Figure 27:
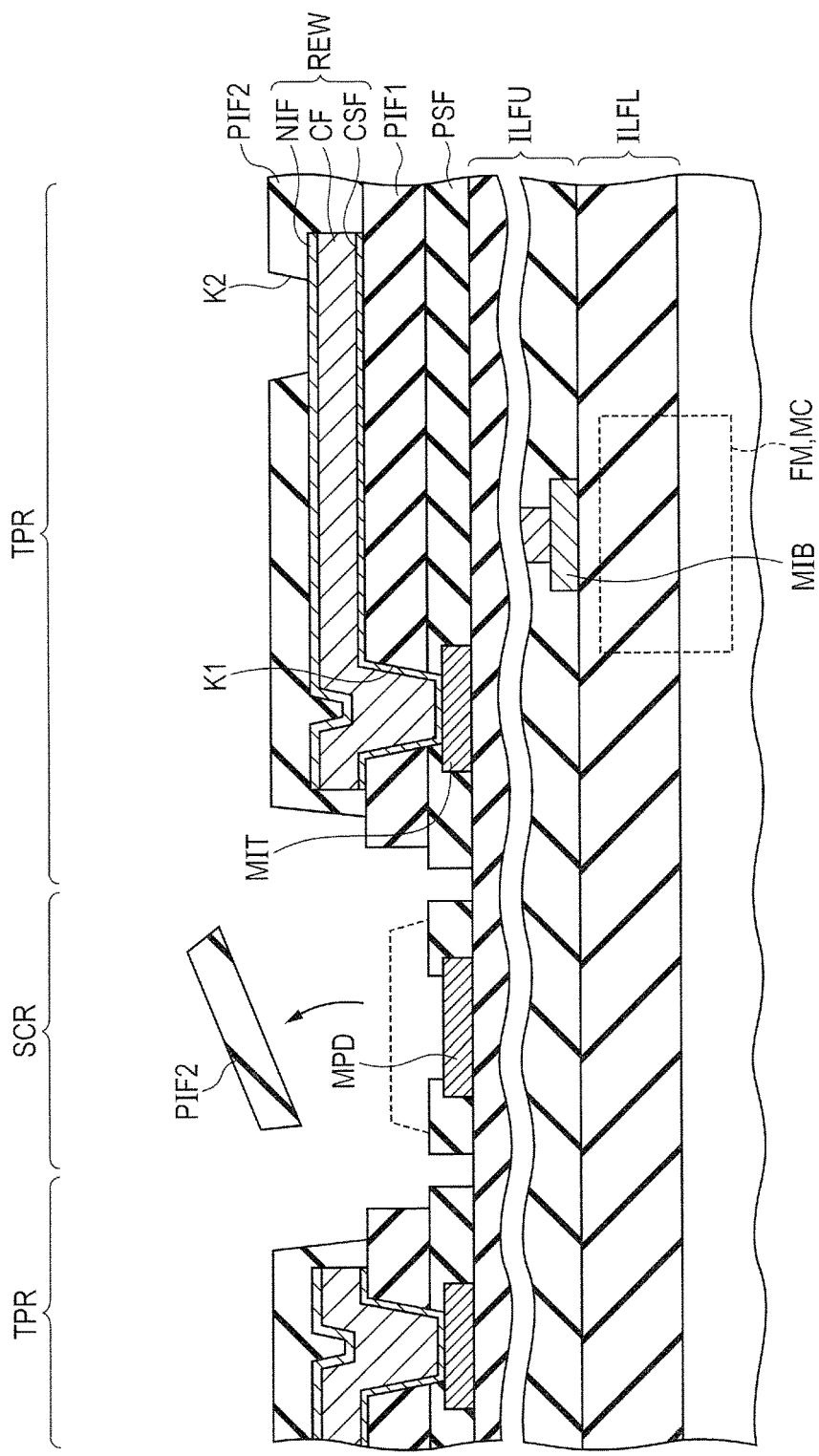
FIG. 27 is a second cross-sectional view showing another problem of the semiconductor device according to Comparative Example.

As shown in FIG. 27, however, when the polyimide film PIF1 that covers the pad electrode MPD is relatively small, the pad electrode MPD is exposed due to peeling of the polyimide film PIF1 and the pad electrode MPD sometimes corrodes. An increase in the size of the polyimide film PIF1 in order to prevent peeling of the polyimide film PIF1, on the other hand, requires an increase in the width of the scribe region SCR.

Further, since the pad electrode MPD is covered with the polyimide film PIF2 during substitution gold plating, the probe test of the flash memory and the test of a test element group formed in the scribe region SCR cannot be performed simultaneously.

In the semiconductor device of First Embodiment compared with the semiconductor device of Comparative Example, the rewiring to which the solder ball SLB is to be coupled has, on the surface thereof, the palladium film PDF. It has been understood as a result of evaluation by the present inventors that the palladium film PDF can prevent deposition of nickel in the nickel film NIF. As a result, the wetness of solder can be maintained and the solder ball can be coupled to the rewiring REW reliably.

Since the palladium film PDF serves to maintain the wetness of solder, an additional step (substitution gold plating step) for maintaining the wetness of solder becomes unnecessary. This contributes to step reduction.

Further, during formation of the palladium film PDF in the chip region TPR, the palladium film PDF is formed so as to cover the pad electrode MPD in the scribe region SCR. This makes it possible to simultaneously perform the probe test of the flash memory and the test of the test element group formed in the scribe region SCR. In addition, since the polyimide film is not formed in the scribe region, an increase in the width of the scribe region SCR necessary for the semiconductor device of Comparative example becomes unnecessary.

In the above-described method of manufacturing the semiconductor device, nickel deposition can be prevented during heat treatment (retention baking) for determining whether or not data written into the flash memory FM have been retained. The heat treatment is not limited to that performed for the flash memory, but nickel deposition can also be prevented even in the heat treatment at from about 200° C. to about 250° C. imposed on an accelerated test for various semiconductor elements formed in the chip region TPR.

Second Embodiment

In this embodiment, a second example of the barrier film will be described. This barrier film is a ruthenium (Ru) film formed by sputtering. Members similar to those of the semiconductor device shown in FIG. 2 or the like will be identified by the same reference numeral and a description on them will not be repeated unless otherwise necessary.

Figure 28:
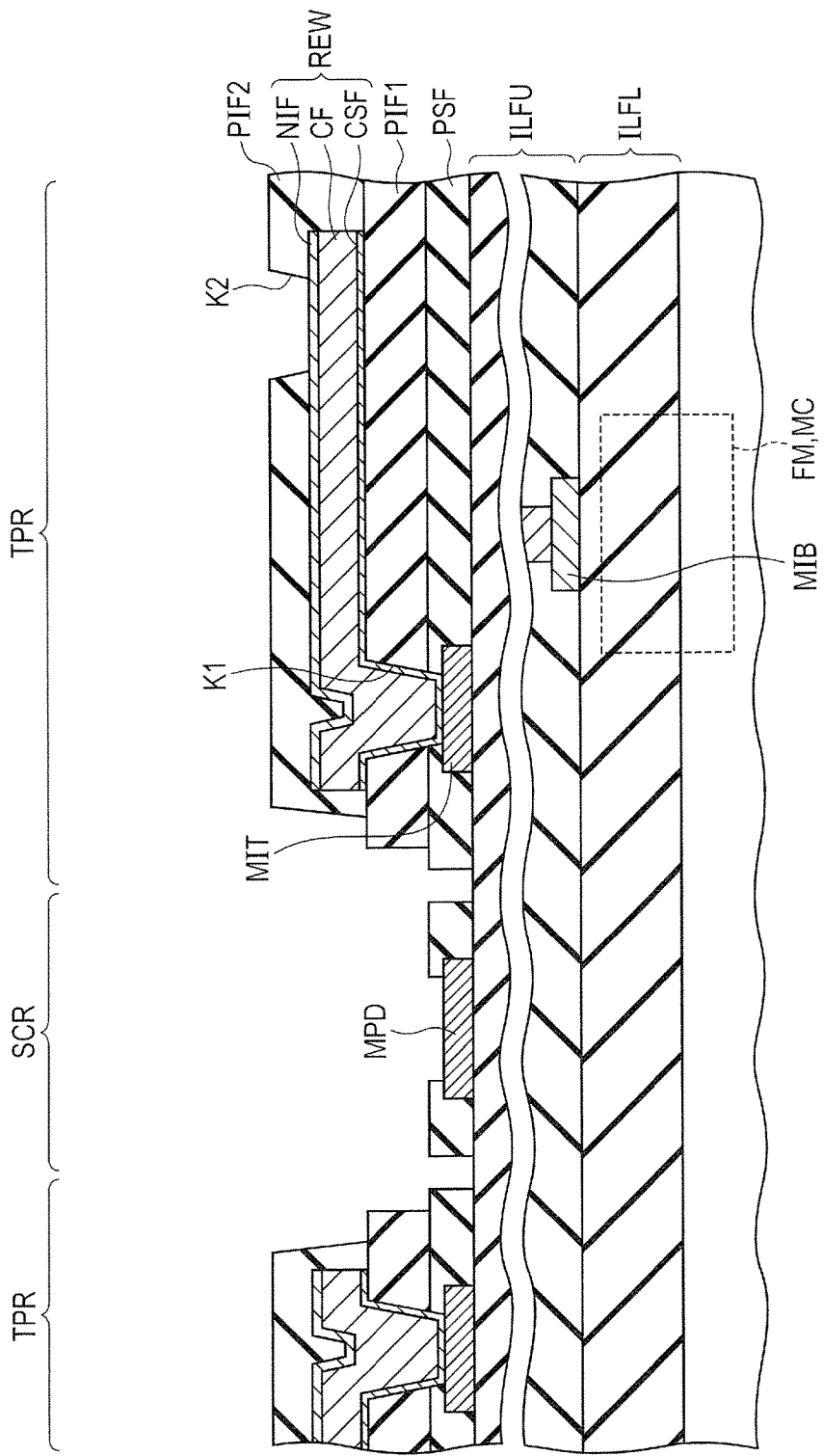
FIG. 28 is a cross-sectional view showing a step of a method of manufacturing a semiconductor device according to Second Embodiment.

First, a manufacturing method will be described. After steps similar to those shown in FIGS. 6 to 11, a polyimide film PIF2 is formed in the chip region TPR so as to cover the rewiring REW, as shown in FIG. 28. The polyimide film PIF2 has therein an opening portion K2 from which the surface of the rewiring REW is exposed. In the scribe region SCR, the polyimide film is removed and the pad electrode MPD is exposed.

Figure 29:
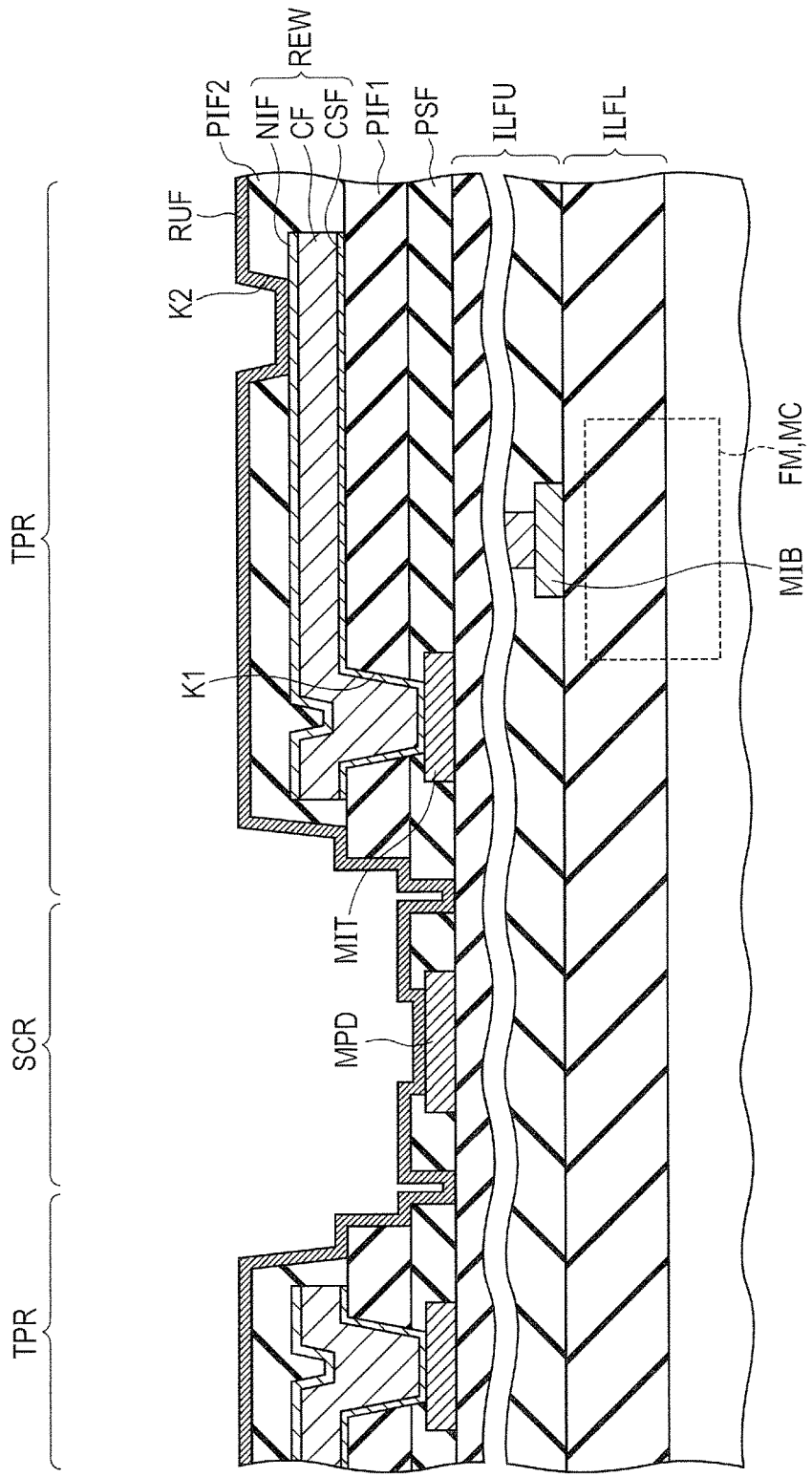
FIG. 29 is a cross-sectional view showing a step following that shown in FIG. 28 in Second Embodiment.
Figure 30:
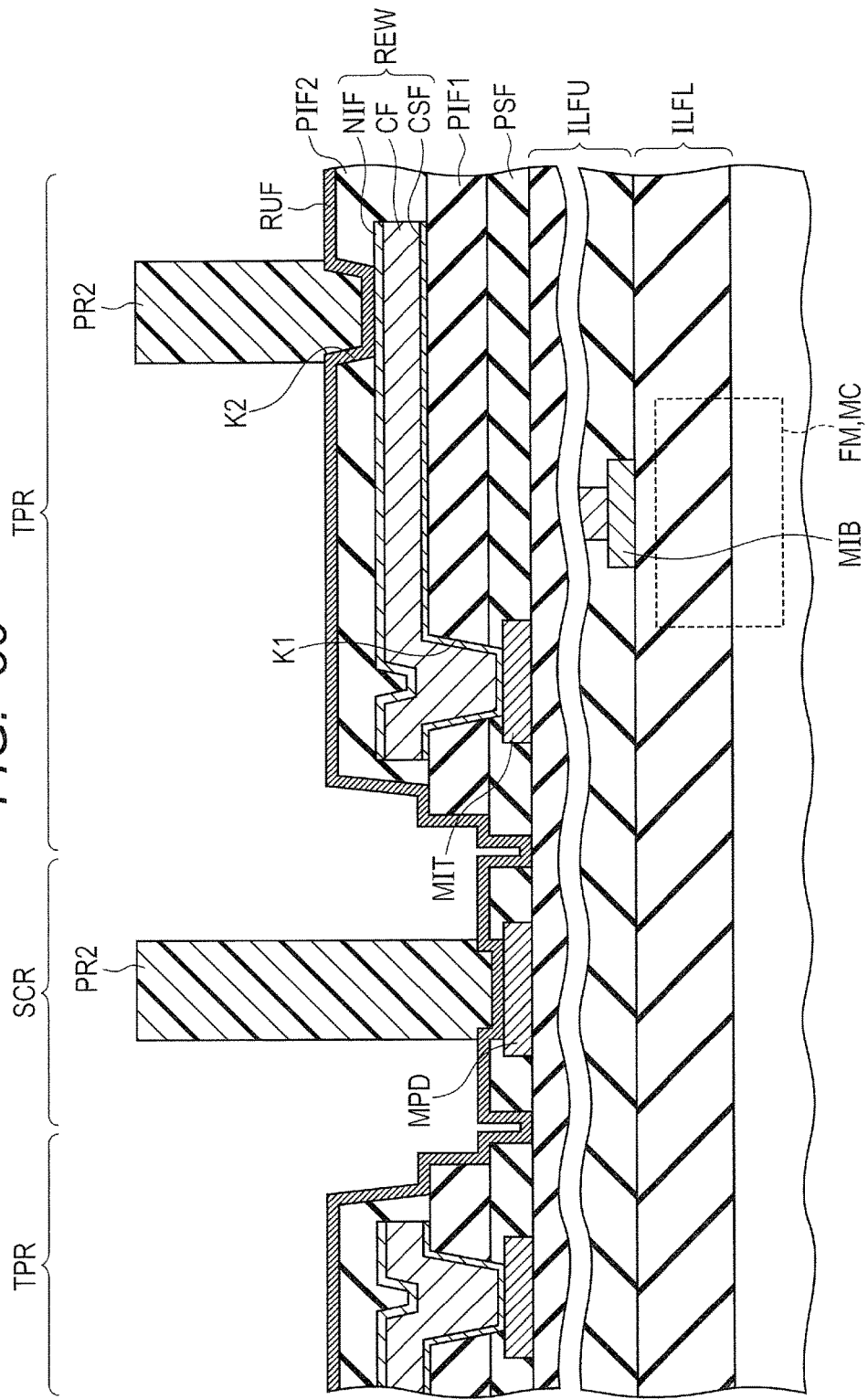
FIG. 30 is a cross-sectional view showing a step following that shown in FIG. 29 in Second Embodiment.
Figure 31:
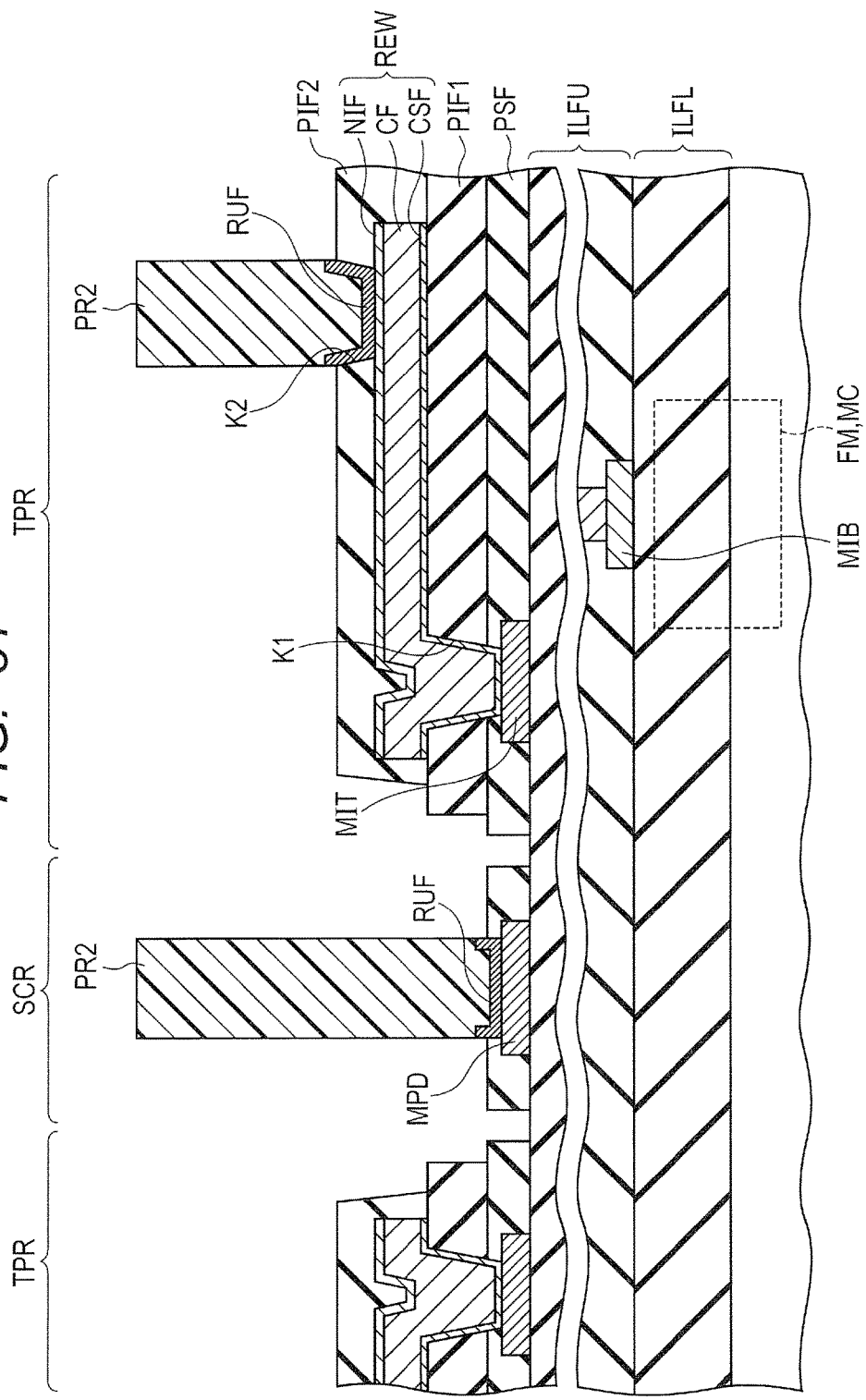
FIG. 31 is a cross-sectional view showing a step following that shown in FIG. 30 in Second Embodiment.
Figure 32:
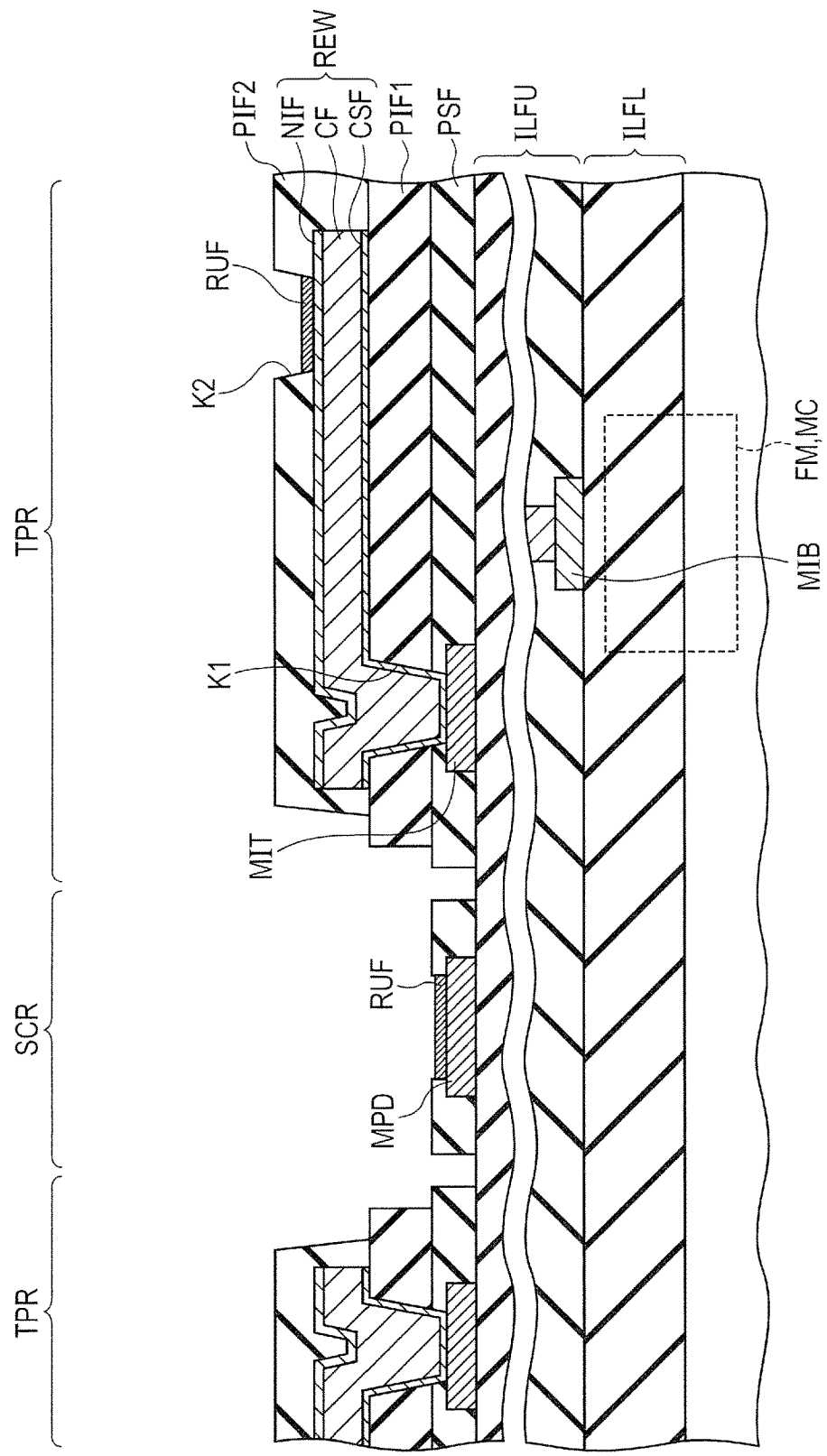
FIG. 32 is a cross-sectional view showing a step following that shown in FIG. 31 in Second Embodiment.

Next, as shown in FIG. 29, a ruthenium film RUF is formed by sputtering so as to cover the exposed portion of the rewiring REW, the pad electrode, and the like. Next, as shown in FIG. 30, predetermined photolithography is performed to form a photoresist pattern PR2. Next, as shown in FIG. 31, with the photoresist pattern PR2 as an etching mask, the exposed portion of the ruthenium film RUF is removed using a predetermined chemical solution. During this etching, the pad electrode MPD covered by the ruthenium film RUF and the photoresist pattern PR2 is prevented from being affected by the chemical solution. Next, as shown in FIG. 32, the photoresist pattern PR2 is removed and the remaining ruthenium film RUF is exposed.

Figure 33:
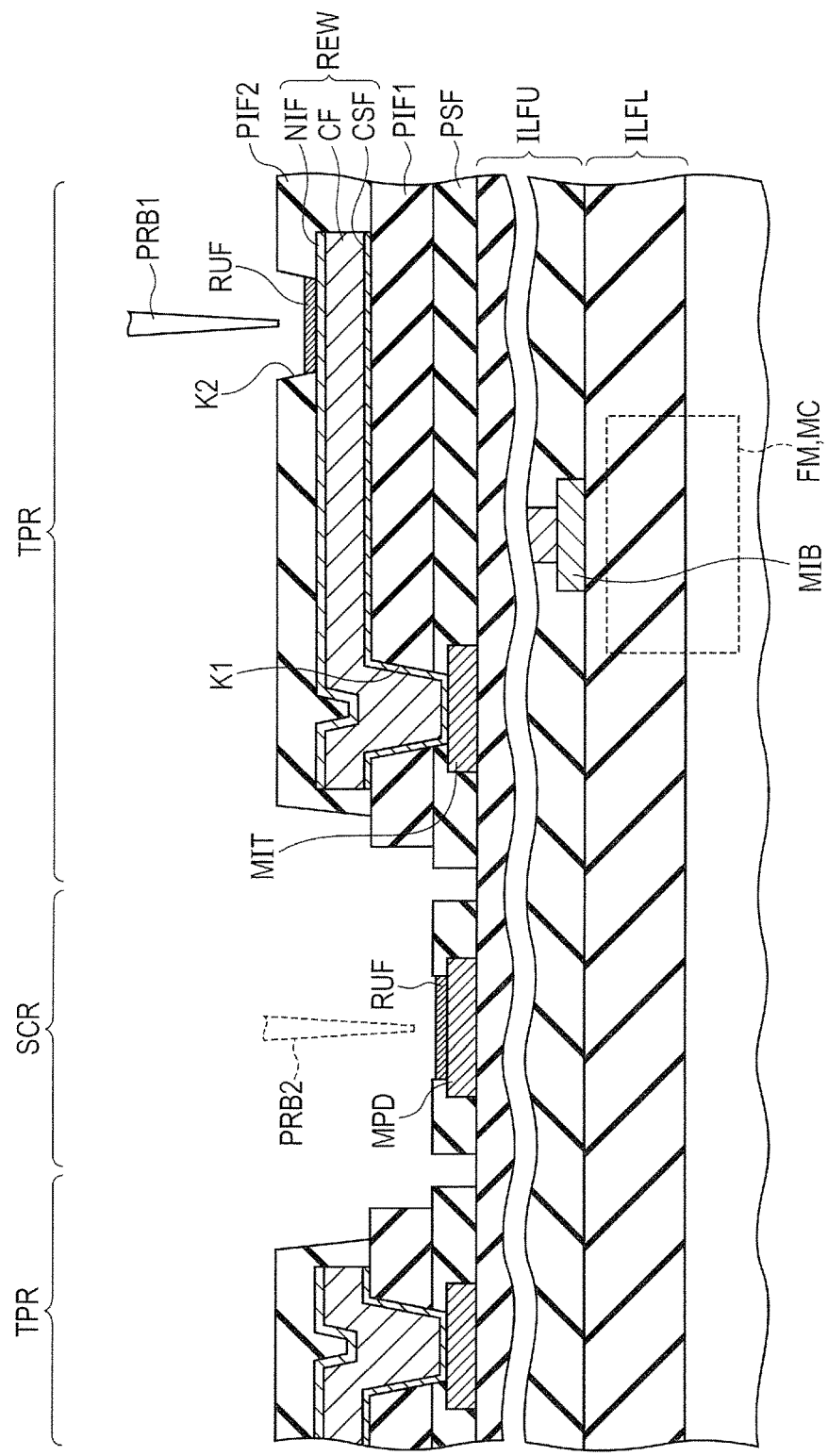
FIG. 33 is a cross-sectional view showing a step following that shown in FIG. 32 in Second Embodiment.

Next, the flash memory as a semiconductor element is subjected to a probe test. As shown in FIG. 33, a probe needle PRB1 is brought into contact with the ruthenium film RUF that covers the rewiring REW and data are written into the memory cell MC of the flash memory FM. Next, the wafer (semiconductor substrate) having the flash memory into which data have been written is heat treated (baked at 250° C. for 12 hours). After the heat treatment, a retention test is performed to known whether or not the data written into the flash memory is retained after the heat treatment. A series of these steps including heat treatment and reading of data are repeated a plurality of times as needed.

A test of a test element group (not shown) formed in the scribe region SCR can be performed at the same time while the series of steps are repeated. For example, by bringing a probe needle PRB2 into contact with the ruthenium film RUF after reading of the data of the flash memory, the electrical characteristics and the like of the test element group formed in the scribe region SCR can be evaluated.

Figure 34:
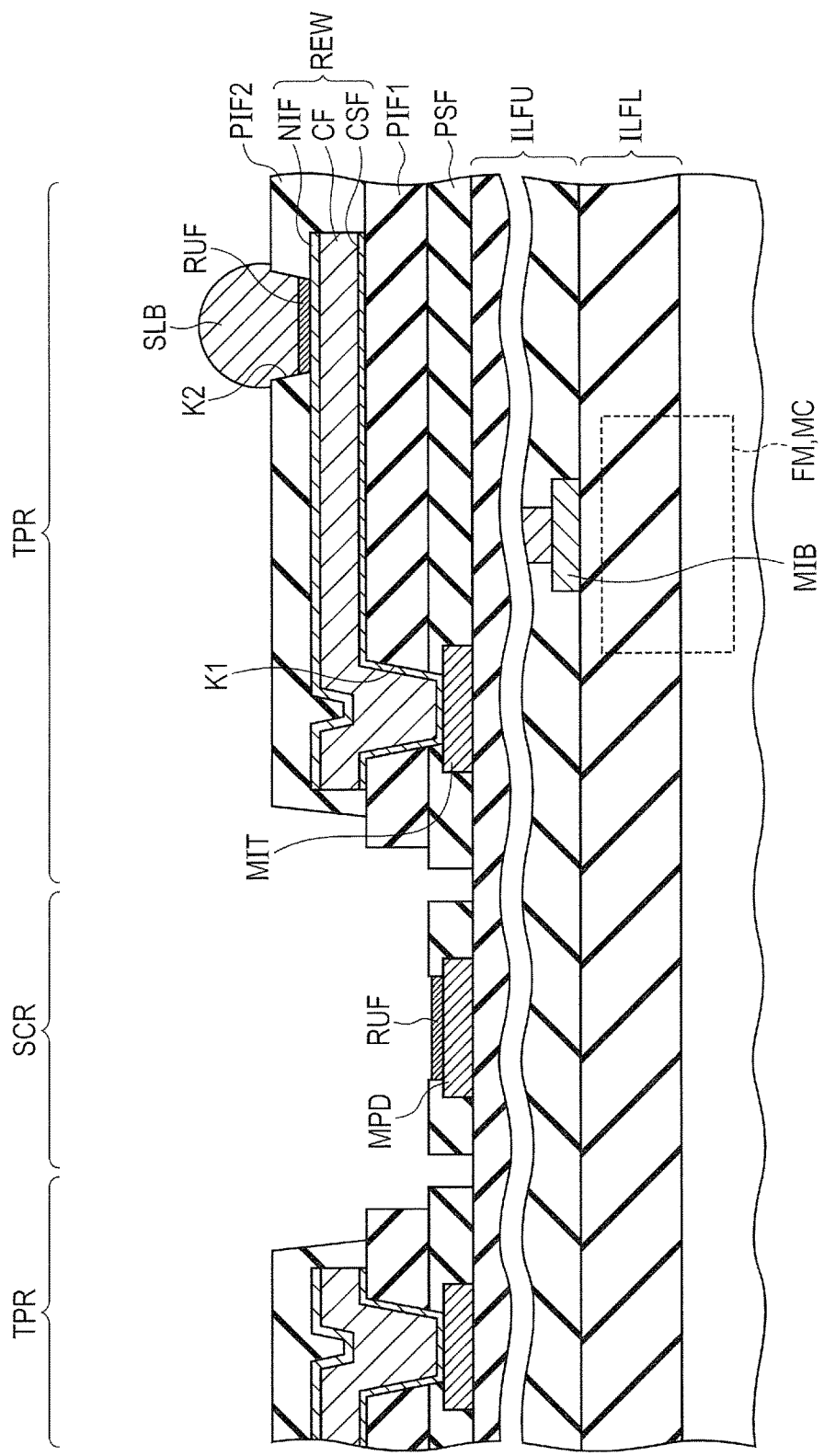
FIG. 34 is a cross-sectional view showing a step following that shown in FIG. 33 in Second Embodiment.
Figure 35:
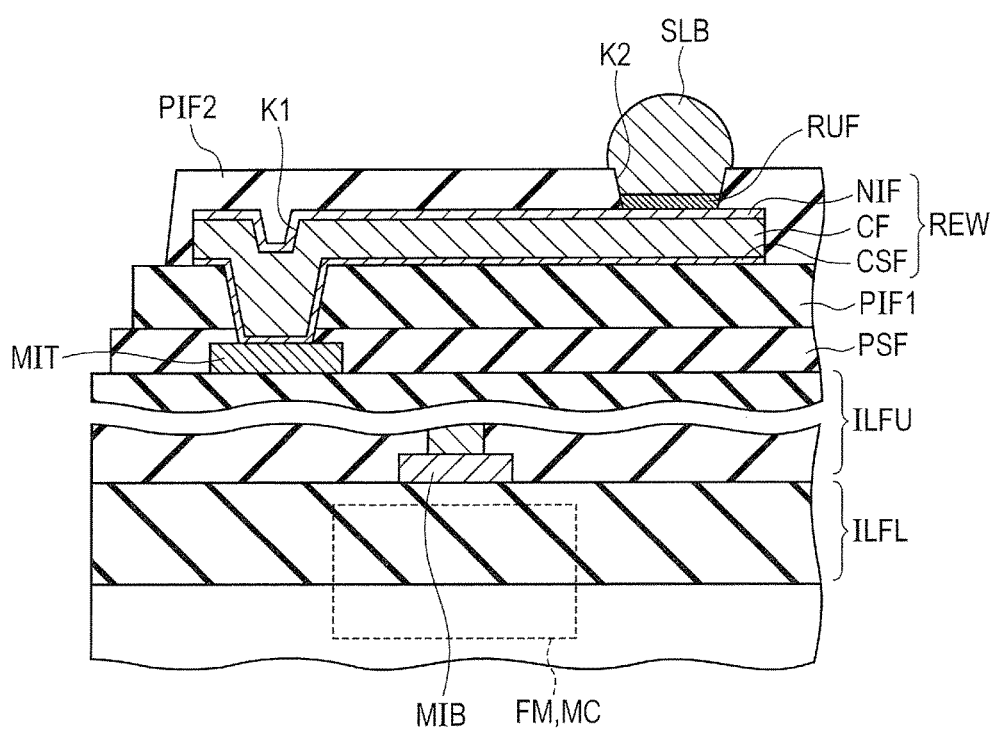
FIG. 35 is a cross-sectional view showing a step following that shown in FIG. 34 and is at the same time, a cross-sectional view of a semiconductor device having a completed main portion in Second Embodiment.

After completion of the series of the probe test of the flash memory and the test of the test element group, a solder ball SLB is coupled to the ruthenium film RUF that covers the rewiring REW as shown in FIG. 34. Then, after visual inspection, shear test of the solder ball SLB, and the like, the wafer is divided into individuals by dicing in the scribe region SCR. In such a manner, the main portion of the semiconductor device is completed as shown in FIG. 35.

In the above-described semiconductor device, the wiring REW has, on the surface thereof to which the solder ball is to be coupled, the ruthenium film RUF. As a film for ensuring wetness of solder, the present inventors have evaluated the ruthenium film in addition to the above-described palladium film. As a result, it has been found that the ruthenium film can prevent deposition of nickel in the nickel film NIF and can therefore ensure the wetness of solder, leading to reliable coupling of the solder ball SLB to the rewiring REW.

Further, since the wetness of solder can be ensured by the ruthenium film RUF, an additional step for ensuring wetness of solder which is necessary for manufacturing the semiconductor device of Comparative Example is not necessary. Still further, the ruthenium film RUF is formed also in the scribe region SCR so as to cover the pad electrode MPD. This makes it possible to perform the test of a test element group formed in the scribe region SCR simultaneously with the probe test of the flash memory.

An increase in the width of the scribe region SCR, which is necessary for the semiconductor device of Comparative Example, is not necessary. According to the evaluation of the present inventors, it has been found that the ruthenium film can prevent deposition of nickel which will otherwise occur by the heat treatment at from about 200° C. to about 250° C. imposed in the acceleration test performed for the flash memory and also for various semiconductor elements formed in the chip region TPR.

Third Embodiment

Formation of a palladium (Pd) film by electroplating, as a variation of the formation method of a barrier film, will be described in Third Embodiment. Members similar to those of the semiconductor device shown in FIG. 2 and the like will be identified by the same reference numeral and a description on them will not be repeated unless otherwise necessary.

Figure 36:
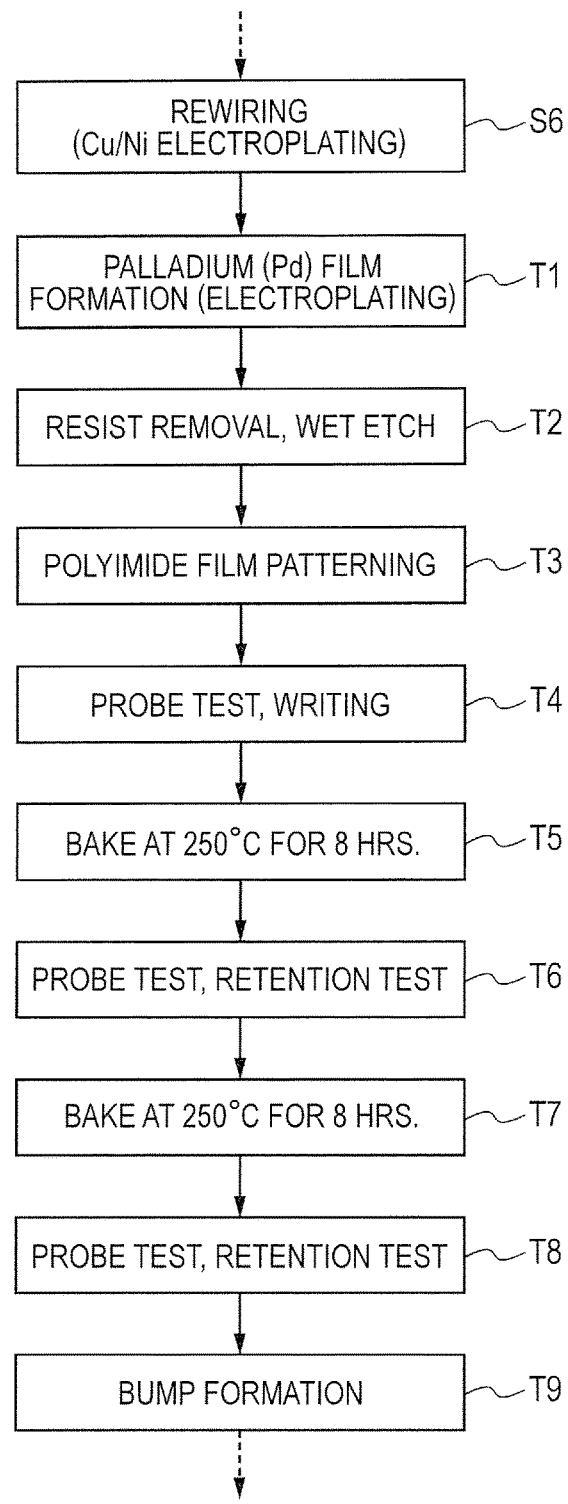
FIG. 36 shows a manufacturing flow of a semiconductor device of Third Embodiment.

First, a manufacturing flow of a semiconductor device is described. First, after a flow similar to that of Steps S1 to S6 (refer to FIG. 4), a palladium film is formed on the surface of the rewiring by electroplating in Step T1 as shown in FIG. 36. Next, in Step T2, a photoresist pattern for forming the rewiring is removed and an exposed portion of the copper seed layer is removed. Next, in Step T3, polyimide is applied to the wafer and a polyimide film having an opening portion from which the rewiring is exposed is formed.

Next, in Step T4, as a probe test, data are written into the flash memory. Next, in Steps T5 to T8, baking (at 250° C. for 12 hours) and a memory retention test are performed alternately. In Step T9, a solder ball (bump) is formed on the surface of the palladium film. Next, after a step similar to Step S16 (refer to FIG. 5), the wafer is divided into individuals by dicing in the scribe region. As a result, semiconductor chips are completed.

Figure 37:
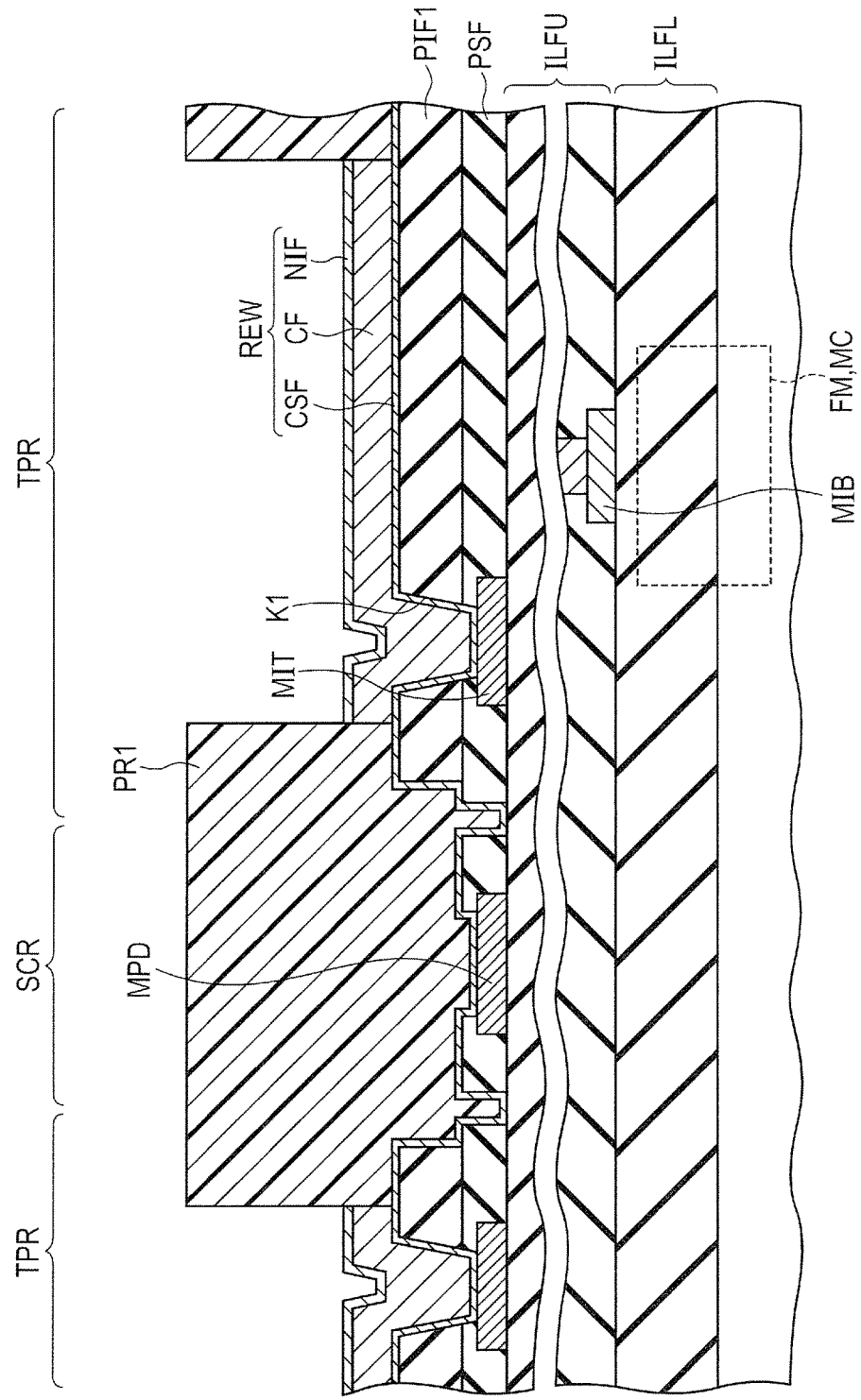
FIG. 37 is a cross-sectional view showing one step of a method of manufacturing the semiconductor device in Third Embodiment.
Figure 38:
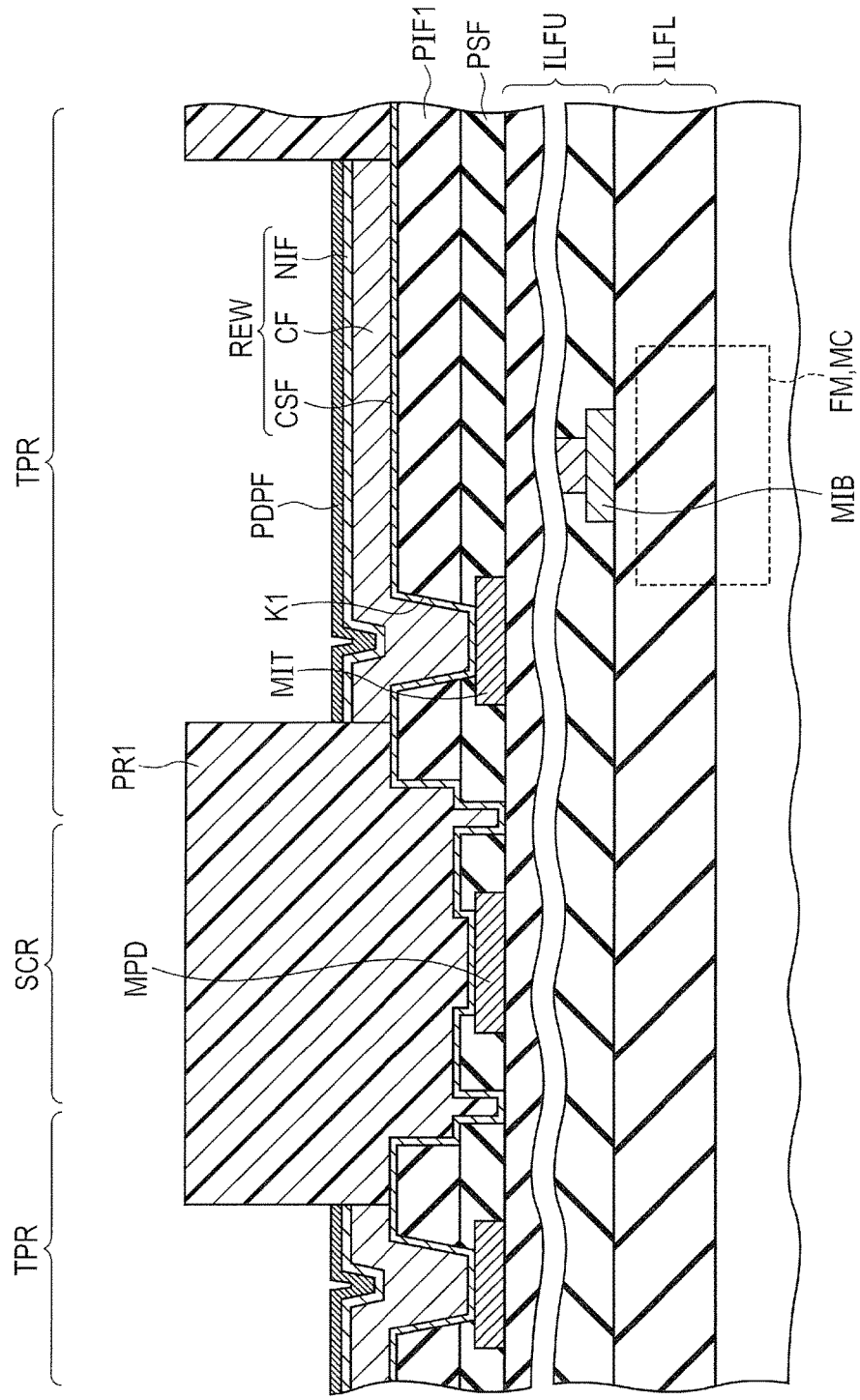
FIG. 38 is a cross-sectional view showing a step following that shown in FIG. 37 in Third Embodiment.

Next, a method of manufacturing the semiconductor device will be described specifically referring to cross-sectional views. First, after steps similar to those shown in FIGS. 6 to 9, a copper rewiring REW is formed as shown in FIG. 37. Next, as shown in FIG. 38, a palladium film PDPF is formed on the surface of the nickel film NIF by electroplating. At this time, the palladium film PDPF is formed on the entire exposed upper surface of the copper rewiring REW (nickel film NIF).

Figure 39:
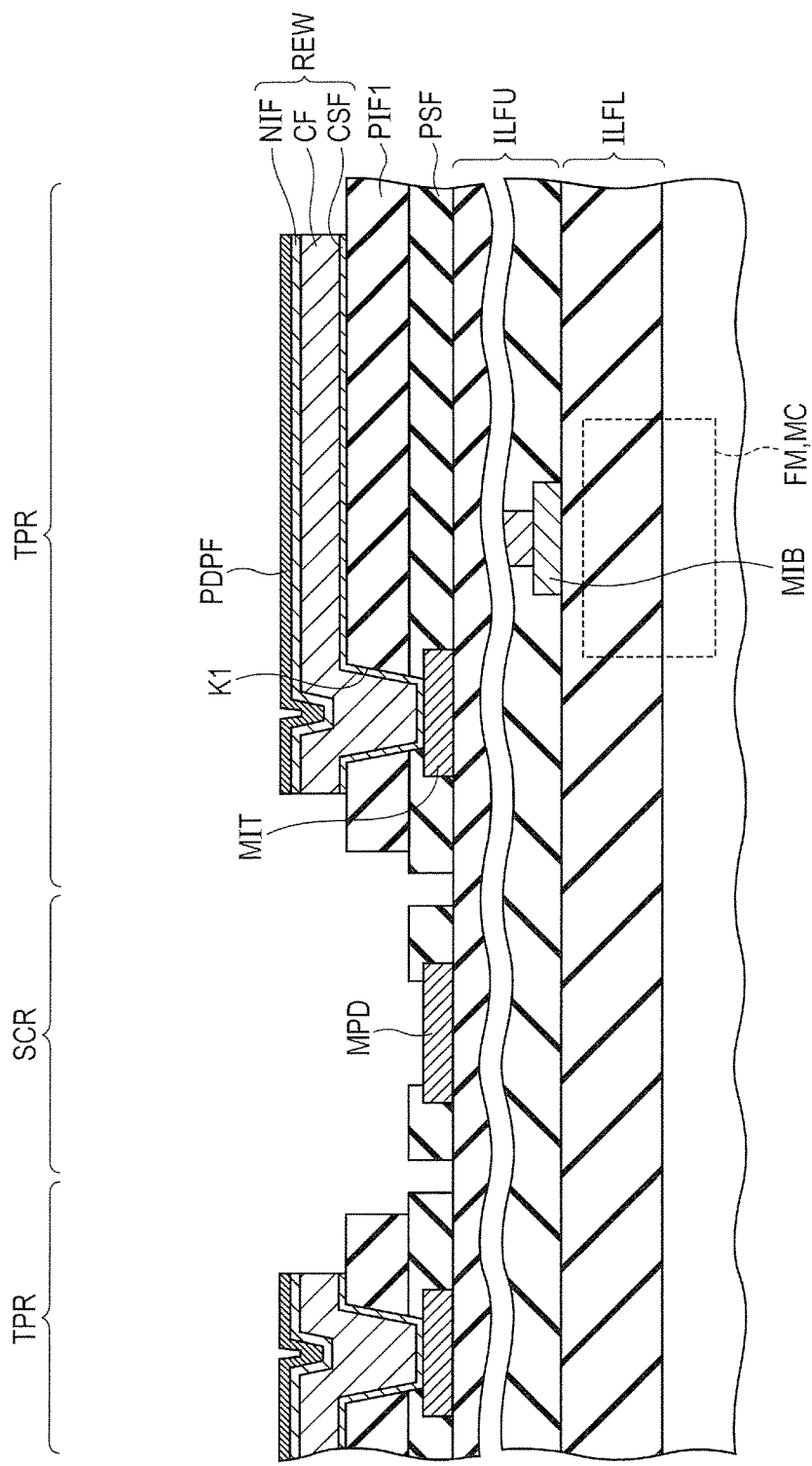
FIG. 39 is a cross-sectional view showing a step following that shown in FIG. 38 in Third Embodiment.

Then, the photoresist pattern PR1 is removed. Next, by removing the exposed portion of the copper seed layer CSF, the rewiring REW is exposed in the chip region TPR as shown in FIG. 39. In the scribe region SCR, the pad electrode MPD is exposed.

Figure 40:
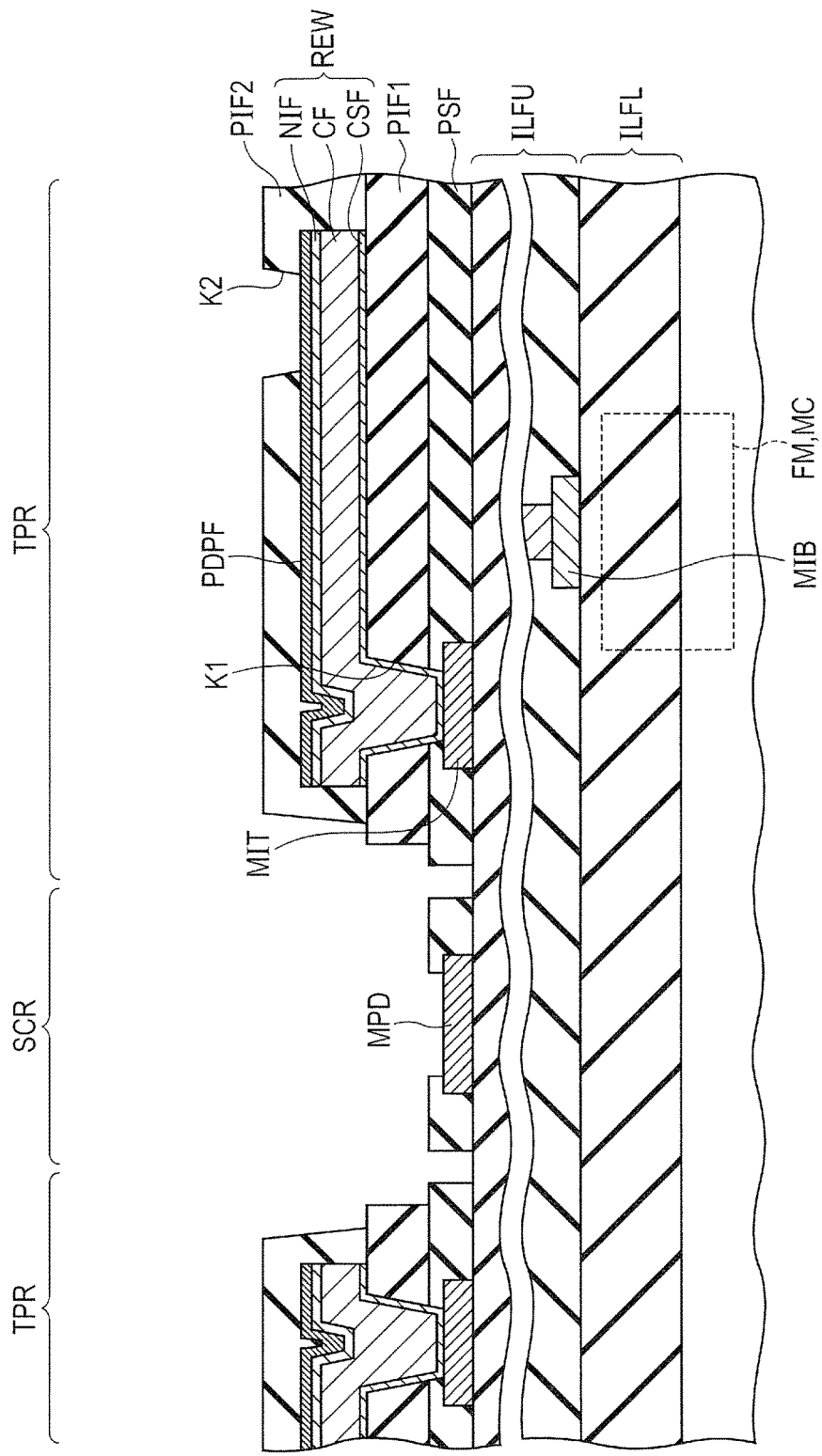
FIG. 40 is a cross-sectional view showing a step following that shown in FIG. 39 in Third Embodiment.

Next, as shown in FIG. 40, polyimide is applied so as to cover the rewiring REW and the like and then by predetermined photolithography and etching, a polyimide film PIF2 is formed. In the chip region TPR, an opening portion K2 is formed in the polyimide film PIF2 and the surface of the rewiring REW is exposed from the opening portion. In the scribe region SCR, the polyimide film is removed and the pad electrode MPD is exposed.

Figure 41:
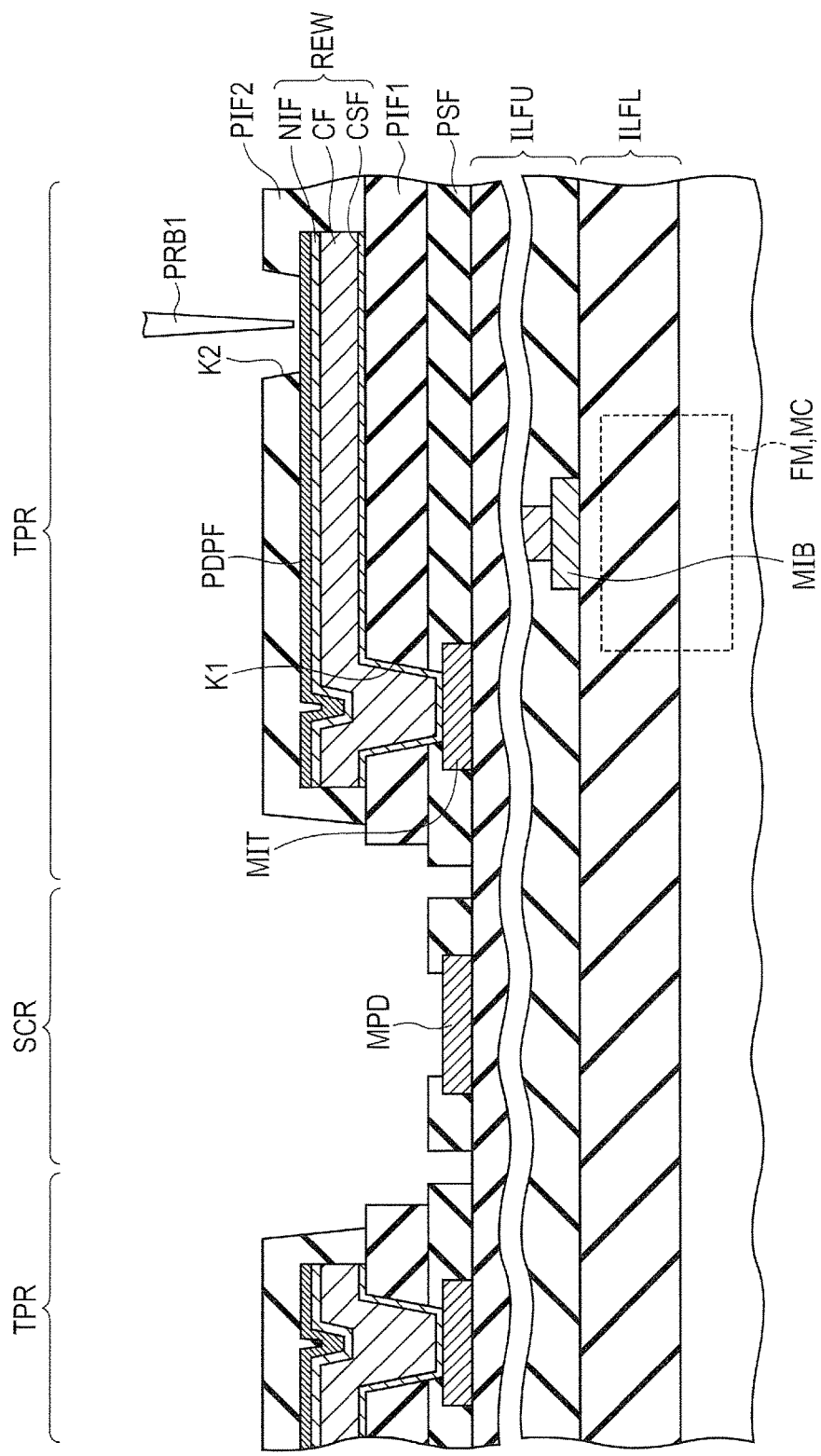
FIG. 41 is a cross-sectional view showing a step following that shown in FIG. 40 in Third Embodiment.

Next, the flash memory as a semiconductor element is subjected to a probe test. As shown in FIG. 41, a probe needle PRB1 is brought into contact with the palladium film PDPF that covers the rewiring REW and data are written into the memory cell MC of the flash memory FM. Next, the wafer (semiconductor substrate) having the flash memory into which data have been written is heat treated (baked at 250° C. for 12 hours). After the heat treatment, a retention test to find whether the data written into the flash memory is retained or not is performed. A series of heat treatment and data reading steps are repeated a plurality of times as needed.

Figure 42:
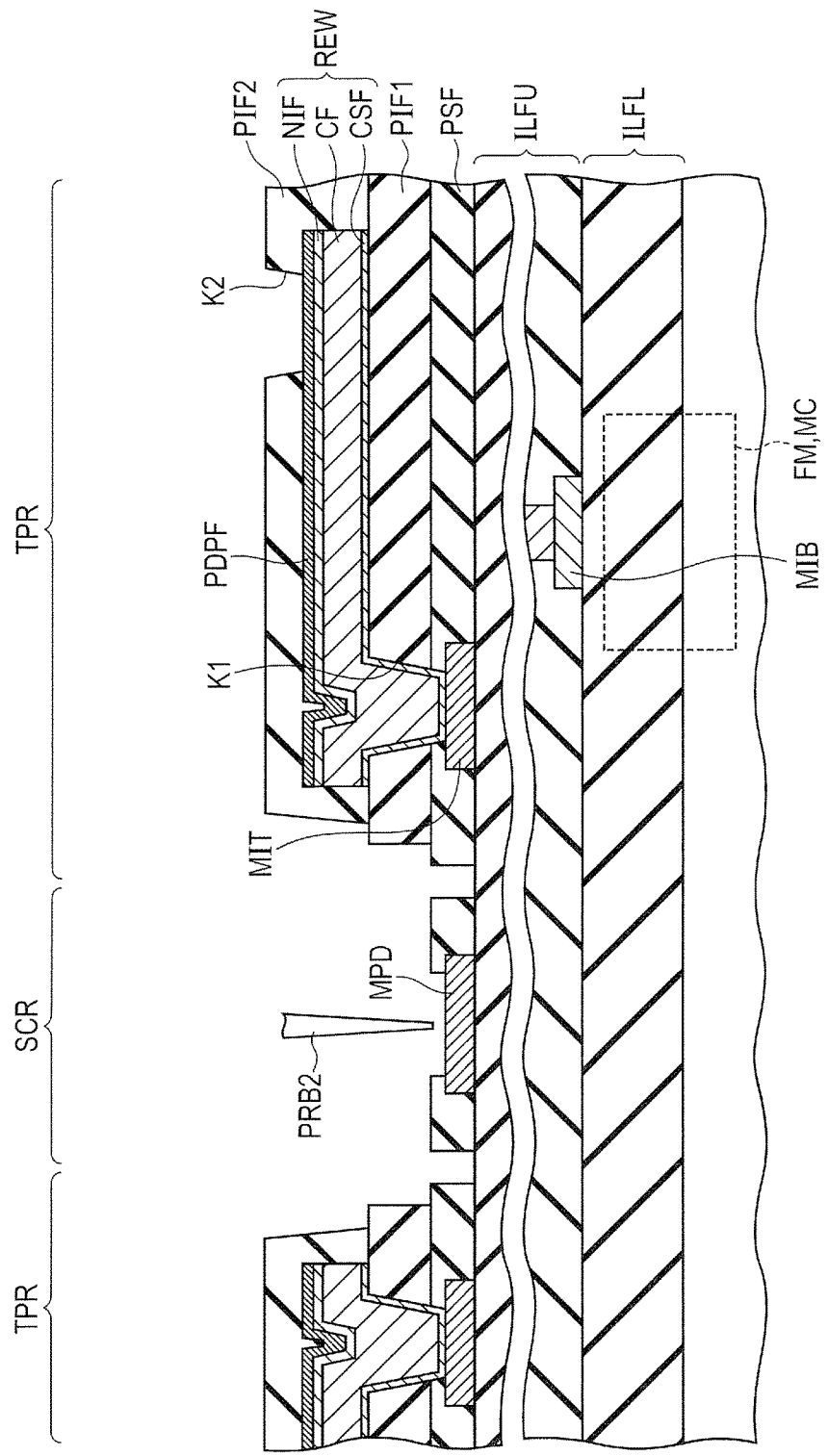
FIG. 42 is a cross-sectional view showing a step performed in combination with the step shown in FIG. 41 in Third Embodiment.

While the series of steps are repeated, a test of a test element group (not shown) formed in the scribe region SCR can be performed simultaneously. For example, after reading data of the flash memory, a probe needle PRB2 is brought into contact with the palladium film PDPF as shown in FIG. 42 to evaluate electrical characteristics and the like of the test element group formed in the scribe region SCR.

Figure 43:
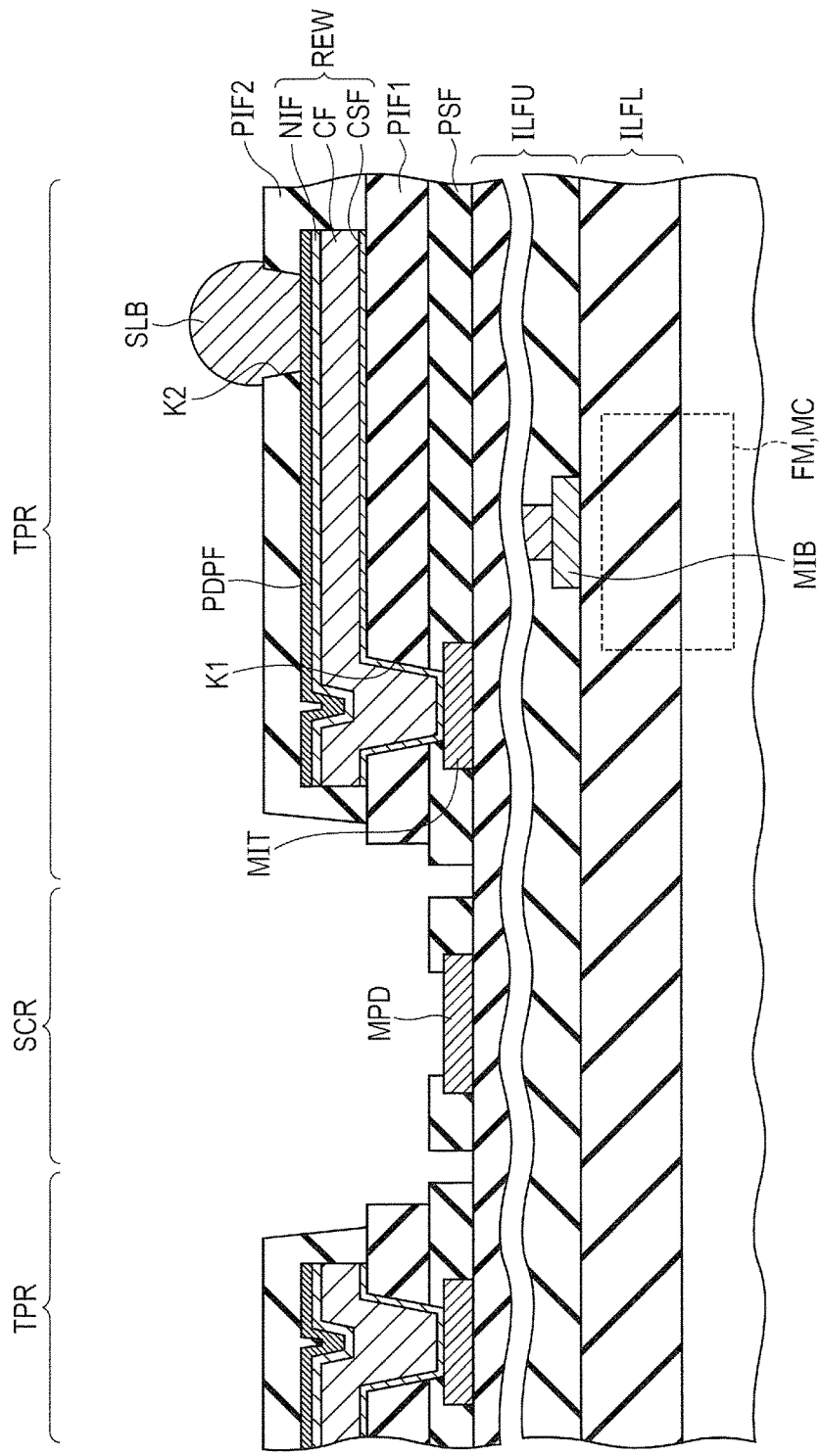
FIG. 43 is a cross-sectional view showing a step following the steps shown in FIGS. 41 and 42 in Third Embodiment.
Figure 44:
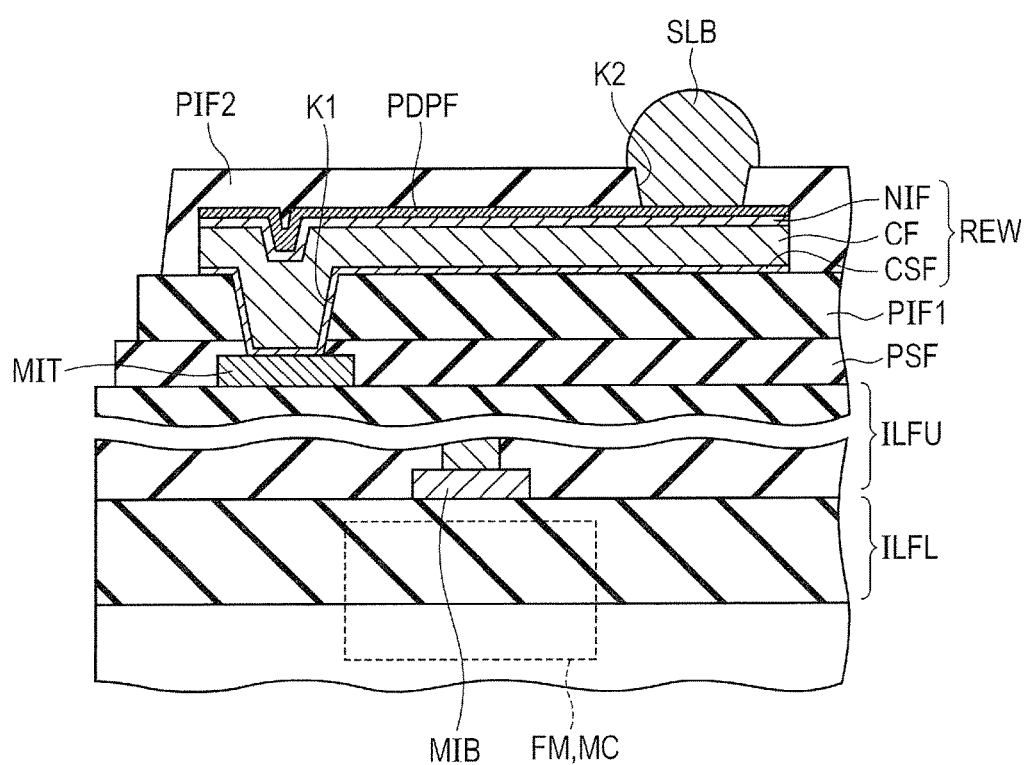
FIG. 44 is a cross-sectional view showing a step following that shown in FIG. 34 and is at the same time, a cross-sectional view of the semiconductor device having a completed main portion in Third Embodiment.

After completion of the series of the probe test of the flash memory and the test of the test element group, a solder ball SLB is coupled to the palladium film PDF that covers the rewiring REW as shown in FIG. 43. Then, after visual inspection, shear test of the solder ball SLB, and the like, the wafer is divided into individuals by dicing in the scribe region SCR. In such a manner, the main portion of the semiconductor device is completed as shown in FIG. 44.

In First and Second Embodiments, as a formation method of the barrier film such as palladium film PDF formed on the surface of the rewiring REW to which the solder ball is coupled, sputtering is given as an example. The present inventors evaluated electroplating as well as sputtering as a variation of the barrier film formation method. As a result, it has been found that the palladium film PDPF formed by electroplating can produce the same level of effect as the palladium film PDPF formed by sputtering.

The present inventors have found that the palladium film PDPF formed by electroplating can also prevent deposition of nickel in the nickel film NIF, the wetness of solder can be ensured, and the solder ball SLB can be coupled reliably to the rewiring REW. In addition, since the wetness of solder can be ensured by the palladium film PDPF, an additional step for maintaining the wetness of solder becomes unnecessary.

Further, in the scribe region SCR, no palladium film is formed and the surface of the pad electrode MPD (surface of aluminum) remains exposed until the wafer is diced. This makes it possible to perform the test for a test element group formed in the scribe region SCR simultaneously with the probe test of the flash memory. Also deposition of nickel can be prevented even in heat treatment at from about 200° C. to about 250° C. imposed in an acceleration test to be performed for the flash memory and also for various semiconductor elements formed in the chip region TPR.

Fourth Embodiment

Here, as a variation of a coupling member for electrical coupling to the outside, a wire to be bonded will be described. Main manufacturing steps are based on those described in First Embodiment. Members similar to those of the semiconductor device shown in FIG. 2 and the like will be identified by the same reference numerals, respectively, and a description on them will not be repeated unless otherwise necessary.

Figure 45:
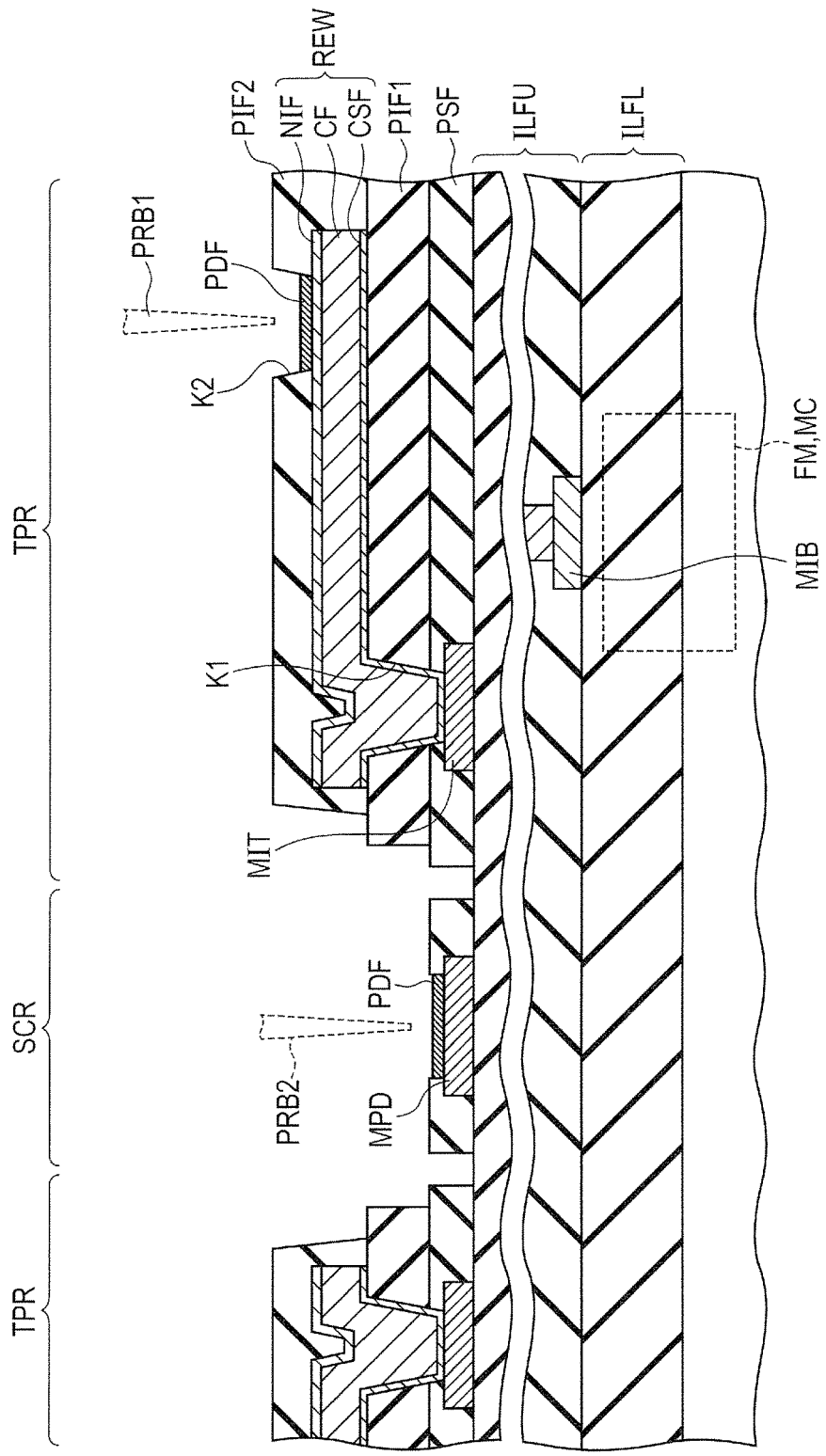
FIG. 45 is a cross-sectional view showing a step of a method of manufacturing a semiconductor device according to Fourth Embodiment.

After steps similar to those shown in FIGS. 6 to 21, the flash memory as a semiconductor element is subjected to a probe test. As shown in FIG. 45, a probe needle PRB1 is brought into contact with the palladium film PDF that covers the rewiring REW and data are written into the memory cell MC of the flash memory FM. Next, the wafer (semiconductor substrate) having the flash memory into which the data have been written is heat treated (baked at 250° C. for 12 hours). After the heat treatment, a retention test is performed so as to find whether the data written into the flash memory is retained or not. A series of the heat treatment and data reading steps are repeated a plurality of times as needed.

While the series of steps are repeated, a test of a test element group (not shown) formed in the scribe region SCR can be performed simultaneously. For example, by bringing a probe needle PRB2 into contact with the palladium film film PDF after reading of the data of the flash memory, the electrical characteristics and the like of the test element group formed in the scribe region SCR can be evaluated.

Figure 46:
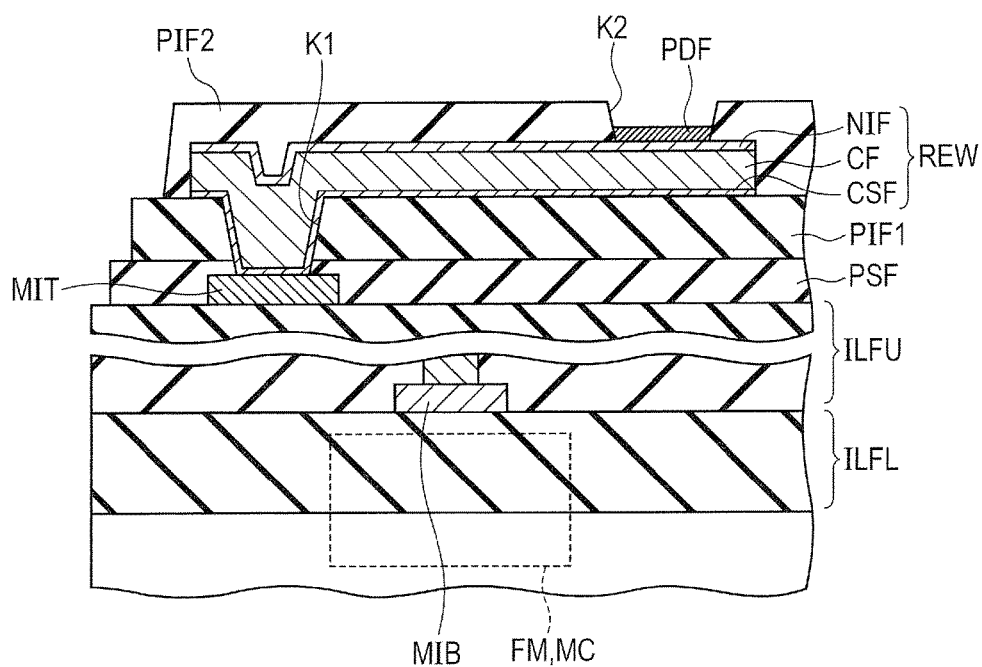
FIG. 46 is a cross-sectional view showing a step following that shown in FIG. 45 in Fourth Embodiment.
Figure 47:
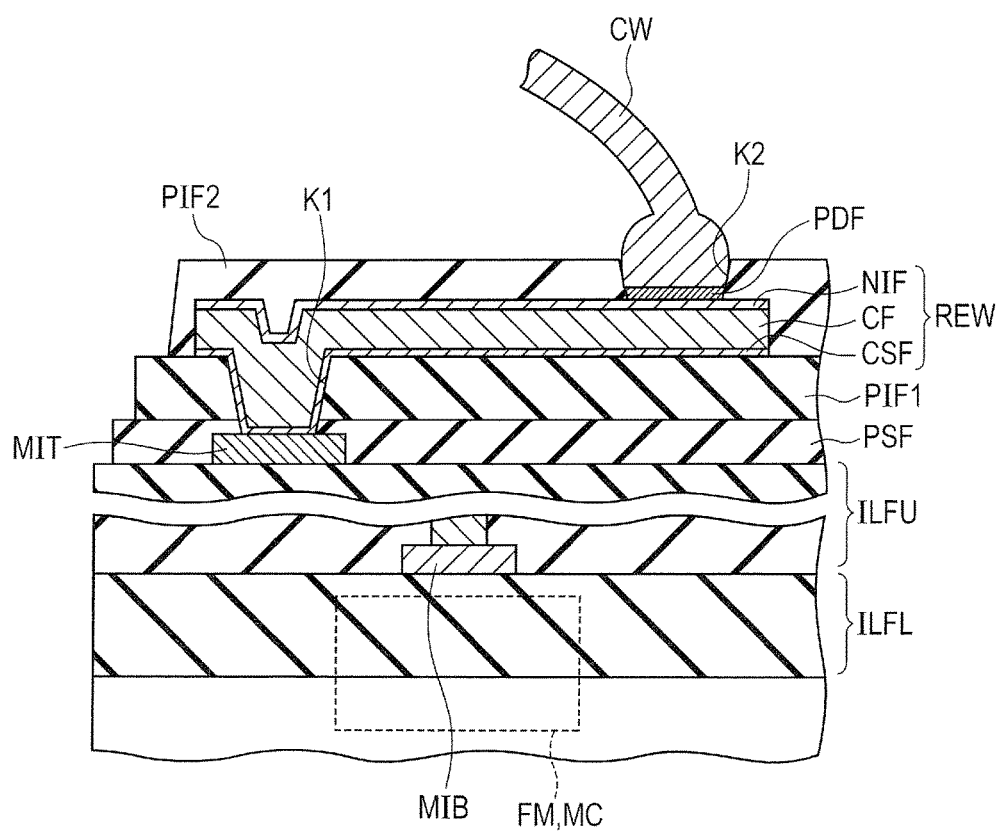
FIG. 47 is a cross-sectional view showing a step following that shown in FIG. 46 and is, at the same time, a cross-sectional view of the semiconductor device having a completed main portion in Fourth Embodiment.

After completion of a series of the probe test of the flash memory and the test of the test element group, visual inspection and the like are performed. The wafer is then divided into individuals by dicing in the scribe region SCR and they are obtained as semiconductor chips. As shown in FIG. 46, the semiconductor chips thus obtained each have, at the periphery thereof, a diced end surface. As shown in FIG. 47, for example, a wire CW made of, for example, copper is then bonded to the palladium film PDF that covers the rewiring REW and a main portion of the semiconductor device is completed.

As described in First Embodiment, the semiconductor device of Comparative Example has, as a barrier film that covers the rewiring REW, a gold film formed by substitution gold plating (refer to FIG. 25 and the like). The gold film formed by substitution gold plating has poor adhesion to the underlying nickel film so that the gold film to which the wire has been bonded is separated from the nickel film. The wire cannot therefore be coupled to the gold film.

The present inventors therefore evaluated the semiconductor device having, as a barrier film that covers the rewiring REW, a palladium film by bonding a wire. As a result, it has been found that the adhesion between the palladium film and the nickel film is very high and even by coupling a wire to the palladium film, the wire can be bonded thereto without causing separation between the palladium film and the nickel film.

It has therefore been found that the above-described semiconductor device has the following advantage in addition to the advantage brought by formation of the palladium film described in First Embodiment. This means that variations in mounting can be increased by using both a solder ball and a wire as a coupling member to be coupled to the palladium film PDF that covers the rewiring REW. Coupling a solder ball enables formation of a semiconductor device by stacking members in a perpendicular direction, while coupling a wire enables widening of the device in a horizontal direction.

The present inventors have evaluated, by an acceleration test (temperature and time), whether or not a difference in film quality of a palladium film depends on the formation method of the palladium film or the like. It has been verified that a palladium film formed by sputtering has a clear boundary between the palladium film and the underlying metal and therefore it reliably functions as a barrier. It has also been found that it is a film having high durability against corrosion.

It has been found, on the other hand, the palladium film formed by electroplating is susceptible to the influence of an impurity in an electroplating solution and the film thickness is not stable, though depending on the degree of the density of the underlying pattern. The present inventors have therefore found that the palladium film reliably functioning as a barrier film is required to have a predetermined thickness or greater, for example, about 100 nm or greater.

The present inventors also have evaluated the palladium film formed by electroless plating. It is difficult to keep the components of an electroless plating solution for long hours and in order to keep a barrier property, durability, and the like, the palladium film should have a thickness greater than that described above, for example, about 200 nm.

The present inventors have made a similar evaluation on ruthenium, rhodium, platinum, and iridium as well as palladium and have verified that they show a tendency similar to that of palladium.

The semiconductor devices described in the above embodiments may be used in various combinations as needed.

The barrier film may be a stacked film obtained by stacking a plurality of films as needed. The present invention made by the present inventors has been described specifically based on embodiments. It is needless to say that the invention is not limited to or by these embodiments but can be changed in various ways without departing from the gist of the invention.

What is claimed is:

1. A method of manufacturing a semiconductor device, comprising:
   defining an element formation region and a scribe region in a semiconductor substrate;
   forming a semiconductor element in the element formation region;
   forming a plurality of wiring layers above the semiconductor element;
   forming, with one of uppermost wiring layers of the wiring layers as a first pad electrode, a first insulating film so as to cover the first pad electrode therewith;
   forming, in the first insulating film, a first opening portion from which the first pad electrode is exposed;
   forming a rewiring over the first insulating film so as to couple the rewiring to the first pad electrode via the first opening portion;
   forming a second insulating film that covers the rewiring and has a second opening portion communicated with the rewiring;
   forming a barrier film over at least a portion of the surface of the rewiring at which the second opening portion is present;
   after formation of the barrier film, testing the semiconductor element while heat treating; and
   coupling, to the barrier film, a coupling member for electrical coupling to the outside,
   wherein the forming of the barrier film further comprises:
      forming at least a film having any one of materials selected from the group comprised of palladium (Pd), ruthenium (Ru), rhodium (Rh), platinum (Pt), and iridium (Ir),
   wherein the forming of the plurality of wiring layers comprises forming a second pad electrode in the scribe region, and
   wherein the forming of the barrier film comprises forming the barrier film on the second pad electrode.

2. The method of manufacturing a semiconductor device according to claim 1, wherein the coupling of the coupling member further comprises:
   coupling a solder ball to the surface of the barrier film exposed from the bottom of the second opening portion.

3. The method of manufacturing a semiconductor device according to claim 2, wherein in the testing of the semiconductor element, the heat treatment is performed at a temperature higher than the melting point of the solder ball.

4. The method of manufacturing a semiconductor device according to claim 1, wherein the forming of the semiconductor element further comprises forming a flash memory, and
   wherein the testing of the semiconductor element further comprises:
      bringing a probe needle into contact with the barrier film; and carrying out a memory retention test of the flash memory with the probe needle being brought into contact with the barrier film.

5. The method of manufacturing a semiconductor device according to claim 1, wherein the forming of the rewiring further comprises:
   forming a copper seed layer so as to cover the first insulating film;
   forming a photoresist pattern having an opening pattern exposing therefrom a portion of the copper seed layer;
   forming, by first electroplating, a copper film over the surface of the copper seed layer exposed from the bottom of the opening pattern of the photoresist pattern; and
   forming, by second electroplating, a nickel film over the surface of the copper film exposed from the bottom of the opening pattern of the photoresist pattern.

6. The method of manufacturing a semiconductor device according to claim 5, wherein the forming of the barrier film comprises:
   forming, after formation of the rewiring but prior to formation of the second insulating film, the film having any one of materials over the upper surface of the rewiring by electroplating.

7. The method of manufacturing a semiconductor device according to claim 6, wherein the defining of the element formation region further comprises:
   defining the scribe region between one element formation region and the other element formation region adjacent to each other,
   wherein the forming of the plurality of wiring layers further comprises:
      forming, with another wiring layer of the uppermost wiring layers of the wiring layers as the second pad electrode, the second pad electrode in the scribe region, and
   wherein the forming of the barrier film further comprises:
      forming the film having any one of materials over the upper surface of the rewiring while covering the scribe region with the photoresist pattern; and
      removing the photoresist pattern after formation of the film having any one of materials and exposing the second pad electrode.

8. The method of manufacturing a semiconductor device according to claim 7, further comprising:
   carrying out another test by bringing another probe needle to the second pad electrode located in the scribe region.

9. The method of manufacturing a semiconductor device according to claim 1, wherein the forming of the barrier film further comprises:
   forming, by sputtering, a film having any one of materials over the surface of the second insulating film including a portion of the surface of the rewiring exposed from the bottom surface of the second opening portion of the second insulating film; and
   leaving at least a first portion of the film having any one of materials which is located at the bottom surface of the second opening portion and removing a portion other than the first portion.

10. The method of manufacturing a semiconductor device according to claim 9, wherein the defining of the element formation region further comprises:
   defining the scribe region between one element formation region and the other element formation region adjacent to each other,
   wherein the forming of the plurality of wiring layers further comprises:
      forming, with another layer of the uppermost wiring layers of the wiring layers as the second pad electrode, the second pad electrode in the scribe region, and
   wherein the forming of the barrier film further comprises:
      forming the film having any one of materials so as to cover therewith the surface of the second insulating film and also the second pad electrode; and
      leaving the first portion located at the bottom surface of the second opening portion and a second portion of the film having any one of materials that covers the second pad electrode and removing a portion other than the first portion and the second portion.

11. The method of manufacturing a semiconductor device according to claim 10, further comprising:
   carrying out another test by bringing another probe needle into contact with the barrier film located in the scribe region and including the second portion of the film having any one of materials.

12. The method of manufacturing a semiconductor device according to claim 1, wherein the coupling of the coupling member further comprises:
   bonding a wire to the surface of the barrier film exposed from the bottom of the second opening portion.

13. The method of manufacturing a semiconductor device according to claim 1, wherein in the forming of the barrier film, a stacked film is formed by stacking at least the film having any one of materials and a film having another material selected from the group.

14. A semiconductor device, comprising:
   an element formation region and a scribe region defined in a substrate;
   a semiconductor element formed in the element formation region;
   a plurality of wiring layers formed above the semiconductor element;
   a first insulating film formed, with one of the uppermost wiring layers of the wiring layers as a first pad electrode, so as to cover the first pad electrode and having a first opening portion reaching the first pad electrode;
   a rewiring formed over the first insulating film so as to be electrically coupled to the first pad electrode via the first opening portion;
   a second insulating film formed so as to cover the rewiring and having a second opening portion reaching the rewiring;
   a barrier film formed over the surface of a portion of the rewiring located at the bottom of the second opening portion; and
   a coupling member coupled to the barrier film for electrically coupling to outside,
   wherein the barrier film comprises a film having any one of materials selected from the group comprised of palladium (Pd), ruthenium (Ru), rhodium (Rh), platinum (Pt), and iridium (Ir),
   wherein the plurality of wiring layers comprises a second pad electrode formed in the scribe region, and
   wherein the barrier film is formed on the second pad electrode.

15. The semiconductor device according to claim 14, wherein the coupling member comprises a solder ball.

16. The semiconductor device according to claim 14, wherein the coupling member comprises a wire.

17. The semiconductor device according to claim 14, wherein the semiconductor element comprises a flash memory.

18. The semiconductor device according to claim 14, wherein the barrier film extends over the entire upper surface of the rewiring including the surface of a portion of the rewiring located at the bottom of the second opening portion.

19. The semiconductor device according to claim 14, wherein the rewiring comprises:
- a copper seed layer;
- a copper film formed over the surface of the copper seed layer; and
- a nickel film formed over the surface of the copper film.

20. The semiconductor device according to claim 14, wherein the barrier film comprises a stacked film obtained by stacking at least the film having any one of materials and a film having another material selected from the group.

* * * * *